(12) United States Patent
Monoi

(10) Patent No.: US 7,414,276 B2
(45) Date of Patent: Aug. 19, 2008

(54) SOLID-STATE IMAGE PICKUP DEVICE AND CHARGE TRANSFER DEVICE

(75) Inventor: Makoto Monoi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 10/902,014

(22) Filed: Jul. 30, 2004

(65) Prior Publication Data

US 2005/0069293 A1 Mar. 31, 2005

(30) Foreign Application Priority Data

Jul. 31, 2003 (JP) ............................. 2003-204515

(51) Int. Cl.
*H01L 31/062* (2006.01)

(52) U.S. Cl. .................. 257/239; 257/233; 257/234; 257/292; 257/E27.133

(58) Field of Classification Search ................ 257/225, 257/232, 233, 238, 239, 251, 291, 292, E31.081, 257/E31.084, E27.131, E27.132, E27.133, 257/226, 234; 348/303, 304, 308, 311
See application file for complete search history.

(56) References Cited

U.S. PATENT DOCUMENTS 4,873,561 A * 10/1989 Wen ........................ 377/62
5,182,647 A * 1/1993 Chang ....................... 348/298
5,199,053 A * 3/1993 Hirama ...................... 377/60
5,438,365 A 8/1995 Yamashita et al.

FOREIGN PATENT DOCUMENTS

| JP | 48-63647 | 9/1973 |
|---|---|---|
| JP | 09-046596 | 2/1997 |
| JP | 09-181298 | 7/1997 |
| JP | 9-233392 | 9/1997 |
| JP | 09-246518 | 9/1997 |
| JP | 10-322599 | 12/1998 |
| JP | 11-164087 | 6/1999 |
| JP | 11-177076 | 7/1999 |
| JP | 2000-232216 | 8/2000 |
| JP | 2003-87657 | 3/2003 |
| JP | 2003-87663 | 3/2003 |

* cited by examiner

*Primary Examiner*—Minh-Loan Tran
*Assistant Examiner*—Benjamin Tzu-Hung
(74) *Attorney, Agent, or Firm*—Oblon, Spivak, McClelland, Maier & Neustadt, P.C.

(57) ABSTRACT

A solid-state image pickup device includes a semiconductor substrate, a photosensitive pixel which converts incident light on the semiconductor substrate into a signal charge, and a charge detection section which converts the converted signal charge into an output signal. The device further includes a charge transfer section which is disposed between the photosensitive pixel and the charge detection section and which temporarily stores the signal charge and which transfers the stored signal charge to the charge detection section by application of sequential pulses.

19 Claims, 27 Drawing Sheets

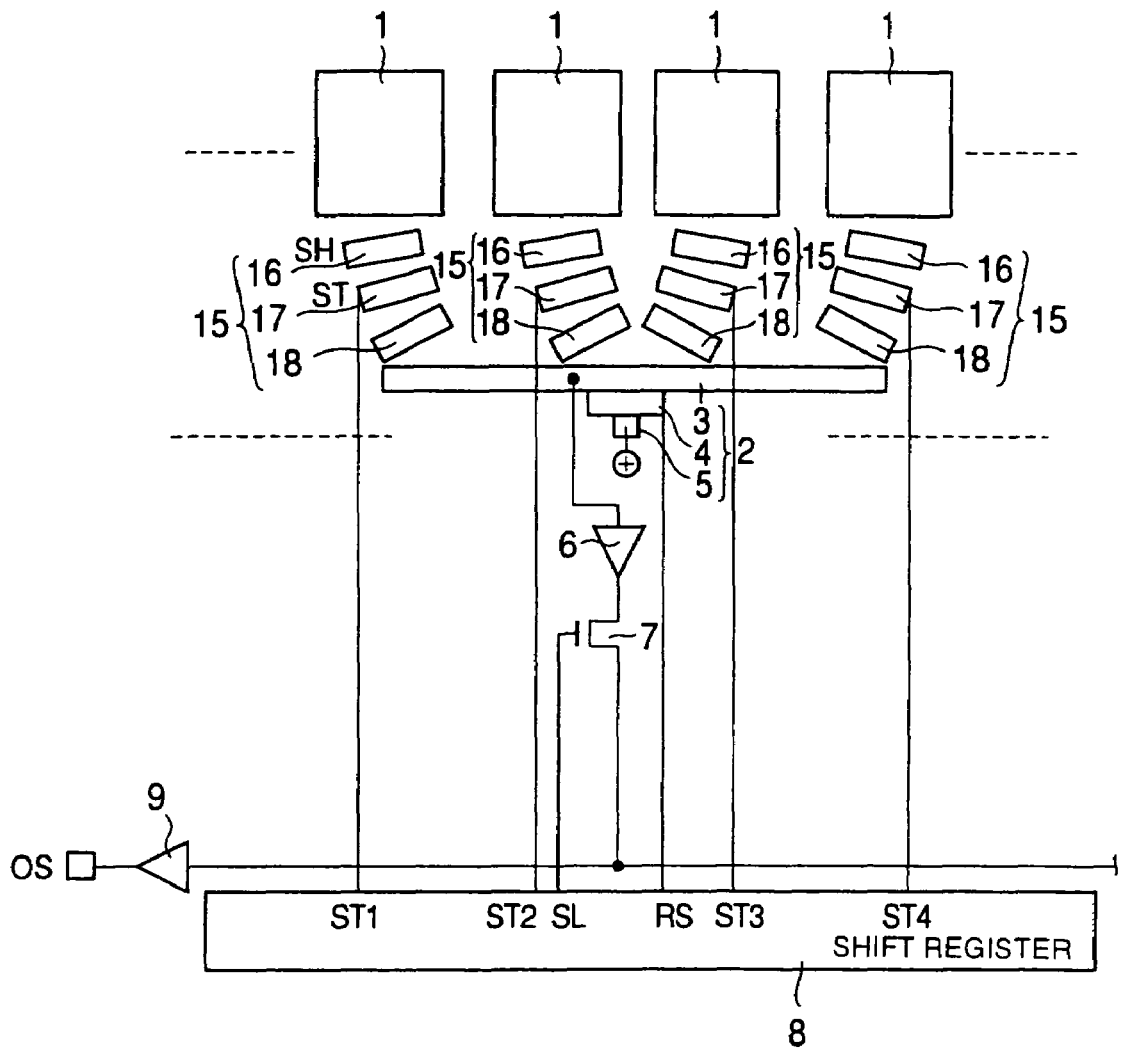
F I G. 14

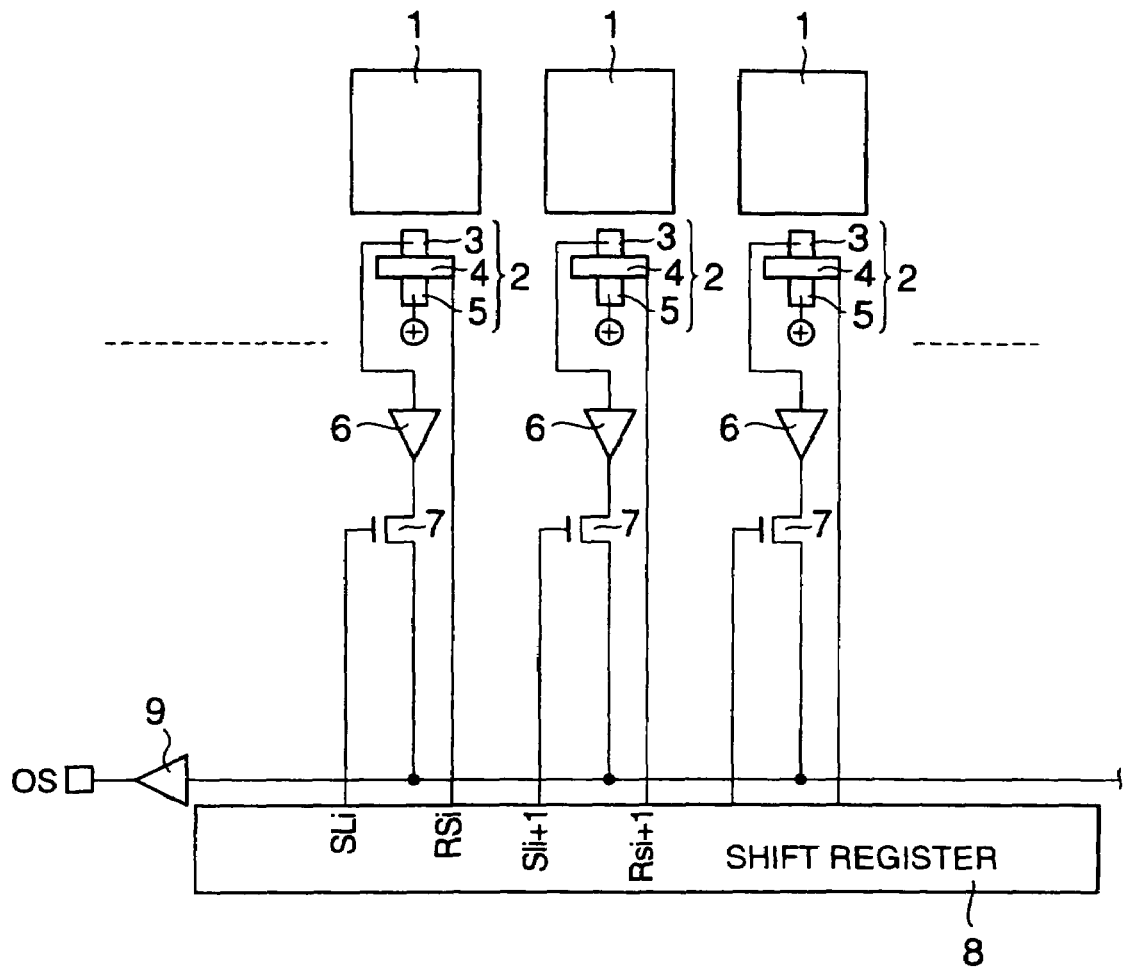
F I G. 25

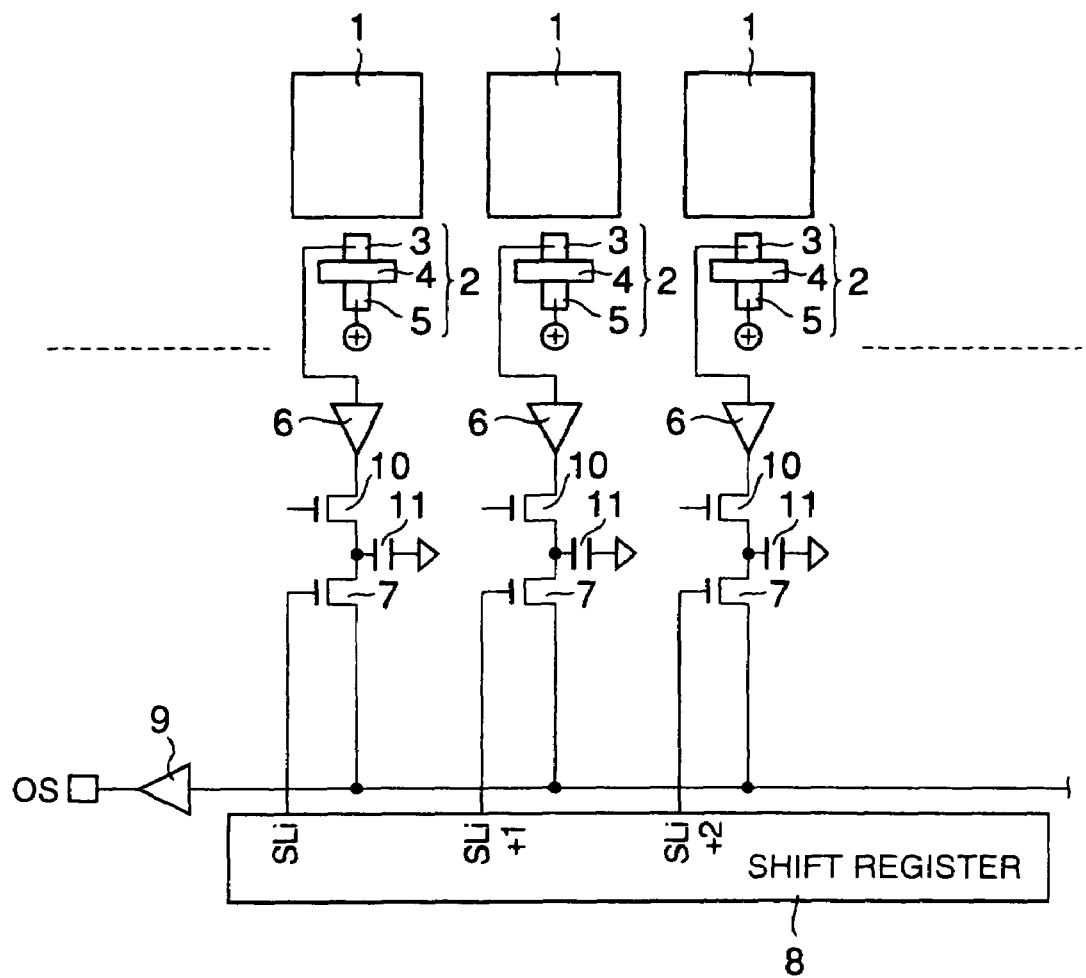
F I G. 28

SOLID-STATE IMAGE PICKUP DEVICE AND CHARGE TRANSFER DEVICE

CROSS REFERENCE TO RELATED APPLICATION

This application is based upon and claims the benefit of priority from the prior Japanese Patent Application No. 2003-204515, filed on Jul. 31, 2003, the entire contents of which are incorporated herein by reference.

BACKGROUND OF THE INVENTION

1. Field of the Invention

The present invention relates to a solid-state image pickup device and an image sensor using this device, and more particularly, it relates to a solid-state image pickup device whose resolution is lowered and which reads a signal at a high speed, and an image sensor using this device.

2. Description of the Related Art

In a one-dimensional image sensor for use in reading an image in a scanner and the like, or a two-dimensional image sensor for use in reading a two-dimensional image of a digital camera, a camera type cellular phone or the like, a solid-state image pickup device has been used. In this solid-state image pickup device, a constitution has been proposed in which an output of a charge detection section disposed in a photosensitive pixel is selected and output when reading an electric charge generated in the photosensitive pixel.

FIG. 25 shows a schematic constitution of a conventional output selection type solid-state image pickup device. In FIG. 25, an image sensor includes photosensitive pixels 1 which convert received light energy into a signal charges by photoelectric conversion, and charge detection sections 2 which detect potentials of the signal charges of the photosensitive pixels 1. Each of the charge detection sections 2 includes a floating diffusion layer 3 in which the electric charge is temporarily stored, a reset gate 4 which sets the potential of the floating diffusion layer 3, and a drain 5 to which a reference voltage is applied via the reset gate 4. The image sensor further includes buffers 6 which convert potential changes of the floating diffusion layers 3 into signal outputs, transistors 7 which select signal outputs of the buffers 6, a shift register 8 which outputs pulses RS for setting the potentials of the floating diffusion layers 3 to the reset gates 4 and which outputs selection pulses SL to the transistors 7, and a buffer 9 which holds a final output.

An operation in the above-described constitution will be described. The electric charges generated in the photosensitive pixels 1 are passed into the floating diffusion layers 3 of the charge detection sections 2, and the potential changes are converted into signal outputs by the buffers 6. The transistor 7 is selectively turned on by a selection pulse (SLi) generated in the shift register 8, the output is selected, and an output signal (OS) is finally output via the buffer 9. To set the potentials of the floating diffusion layers 3, a pulse (RSi) is applied to the reset gate 4 in such a manner that the drain 5 to which the reference voltage has been applied conducts.

Additionally, according to the constitution of the conventional solid-state image pickup device shown in FIG. 25, a signal storage time of the i-th photosensitive pixel 1, and that of the i+1-th photosensitive pixel 1 differ with each pixel as shown by arrows Pa and Pb shown in FIG. 26, and restrictions on use are sometimes generated. When the stored electric charge of a certain pixel is read as the signal, another pixel stores the signal in some case. Therefore, for example, when LEDs of three colors of red (R), green (G), and blue (B) are alternately lit as color light sources, a lighting time needs to be separated from a reading time, and there has been a problem that the whole reading time lengthens. The operation at this time is shown in waveform diagrams of FIGS. 27(a) to (d). For example, a time when each light source lights by LED_R of FIG. 27(a) and LED_G of FIG. 27(b), and a time when the signal is read in FIG. 27(d) are required for a period shown by arrows for which "G-integration" is described in the figure.

As a constitution in which simultaneous reading is possible in the conventional solid-state image pickup device shown in FIG. 25, a switching transistor 10 for switching and a capacitance 11 for holding the signal may be disposed between the buffer 6 for converting the potential change of the floating diffusion layer 3 into the signal output and the transistor 7 which is selectively turned on by the selection pulse generated by the shift register 8 in order to hold the signal as in a solid-state image pickup device in a different conventional example shown in FIG. 28. However, according to the solid-state image pickup device by the other conventional example shown in FIG. 28, there has been a problem that noises increase or a circuit area increases by the switching transistor 10.

According to the conventional solid-state image pickup devices described above, there has been a problem that a fluctuation is generated in the signal storage time for each photosensitive pixel to cause the restrictions on the use, or that the total reading time lengthens in a case where the lighting time has to be separated from the reading time. In the constitution in which the capacitance for holding the signal and the switching transistor are disposed in order to allow the simultaneous reading, there has been a problem that the increase of the noise or the circuit area is caused.

SUMMARY OF THE INVENTION

A solid-state image pickup device according to the present invention, comprises a semiconductor substrate, a photosensitive pixel which converts incident light on the semiconductor substrate into a signal charge, and a charge detection section which converts the converted signal charge into an output signal, and the device further comprises a charge transfer section which is disposed between the photosensitive pixel and the charge detection section and which temporarily stores the signal charge and which transfers the stored signal charge to the charge detection section by application of sequential pulses.

BRIEF DESCRIPTION OF THE DRAWINGS

FIG. 14 is a circuit block diagram showing a schematic constitution of the solid-state image pickup device according to a sixth embodiment of the present invention in which one charge detection section is disposed for four pixels;

FIG. 25 is a constitution diagram showing a schematic constitution of a conventional output selecting type solid-state image pickup device;

FIG. 28 is a constitution diagram showing a constitution example of a simultaneous storage time of a modification of the conventional solid-state image pickup device.

DESCRIPTION OF THE EMBODIMENTS

Embodiments of the present invention will be described hereinafter in detail with reference to the accompanying drawings. First, a solid-state image pickup device according to a first embodiment of the present invention will be described with reference to FIGS. 1 to 4.

Figure 1:
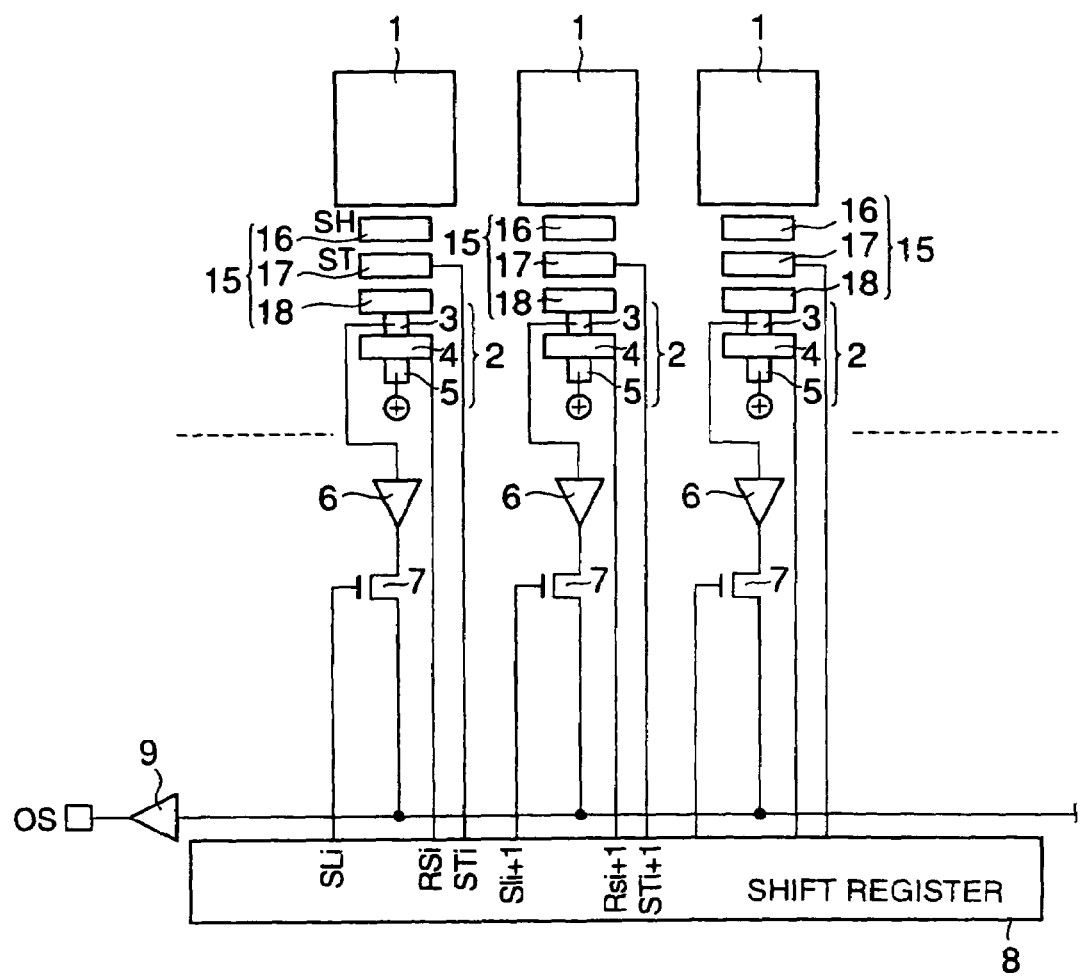
FIG. 1 is a circuit block diagram showing a schematic constitution of a solid-state image pickup device according to a first embodiment of the present invention.

FIG. 1 is a circuit block diagram showing a schematic constitution of the solid-state image pickup device according to the first embodiment. Parts denoted with the same reference numerals as those of FIG. 25 show constituting elements which are the same as or correspond to those of related arts.

As shown in FIG. 1, the solid-state image pickup device according to the first embodiment includes charge transfer sections 15 between photosensitive pixels 1 and charge detection sections 2. Each of the charge transfer sections 15 includes: a first electrode 16 which collectively releases signal charges temporarily stored in the photosensitive pixel 1 by application of a pulse SH; a second electrode 17 which is a storage electrode for temporarily storing the signal charges that have flown from the photosensitive pixel 1 by the releasing of the first electrode 16; and a third electrode 18 functioning as a bias electrode for transferring electric charges, when transferring the signal charges temporarily stored in the second electrode 17 that is the storage electrode into the charge detection section 2 by the application of a pulse ST successively output from a shift register 8 onto the second electrode 17. Constitutions of and after the charge detection sections 2 are similar to those of a conventional solid-state image pickup device shown in FIG. 25.

Figure 2:
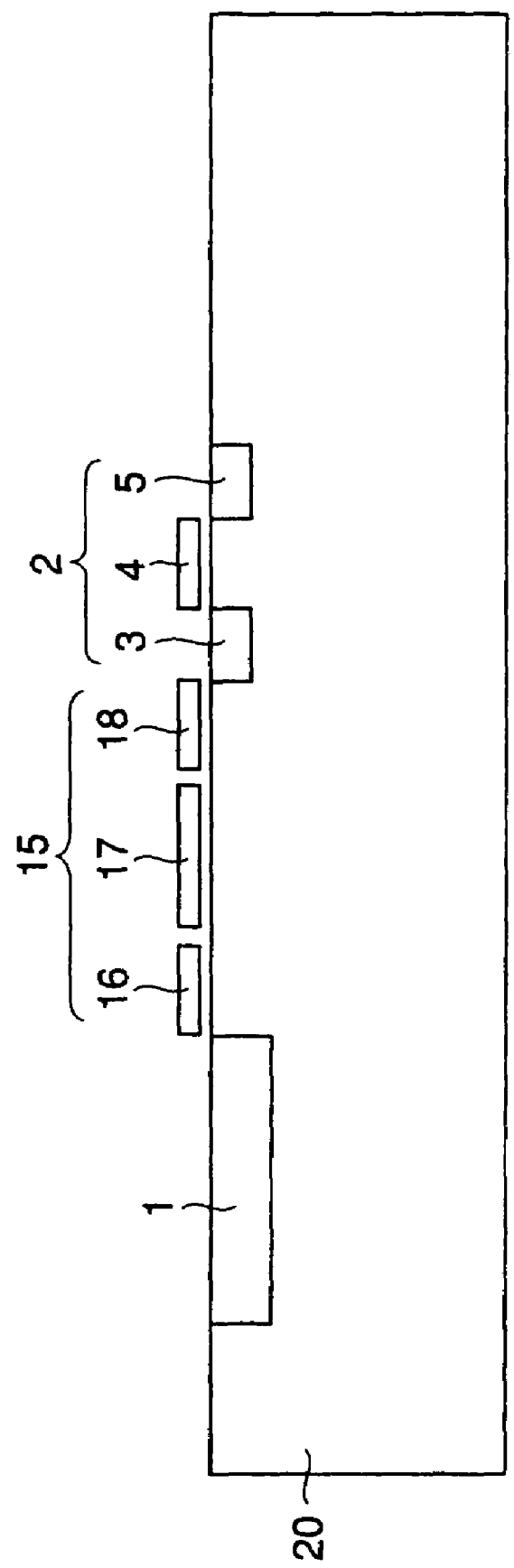
FIG. 2 is a schematic sectional view showing a sectional constitution of the solid-state image pickup device of a first embodiment in which first to third electrodes are formed in one layer.

Sectional constitutions of the photosensitive pixel 1, charge detection section 2, and charge transfer section 15 are shown in FIG. 2. In FIG. 2, the photosensitive pixel 1, a floating diffusion layer 3 of the charge detection section 2, and a drain 5 to which a reference voltage is applied are buried in the surface of a semiconductor substrate 20 on one side. A reset gate 4 of the charge detection section 2 and the first to third electrodes 16, 17, 18 constituting the charge transfer section 15 are formed in the same single layer via an insulating film (not shown). A plurality of electrodes are formed in the single layer via the insulating layer between the electrodes and the semiconductor substrate in this manner, and may be simultaneously formed as elements of the same layer by the same process, when constituting another metal oxide semiconductor field effect transistor (MOSFET) such as the reset gate 4.

It is to be noted that to form the plurality of electrodes in the single layer between the photosensitive pixel 1 and the charge detection section 2, a technique has to be established in which fine gaps are disposed among the first to third electrodes 16, 17, 18 of FIG. 2 to secure insulation among the electrodes. By a rapid progress of a manufacturing process technique of a semiconductor device in recent years, fine processing has been possible. Therefore, the fine gaps can be formed among the first to third electrodes, and the solid-state image pickup device according to the first embodiment can be manufactured.

Figure 3:
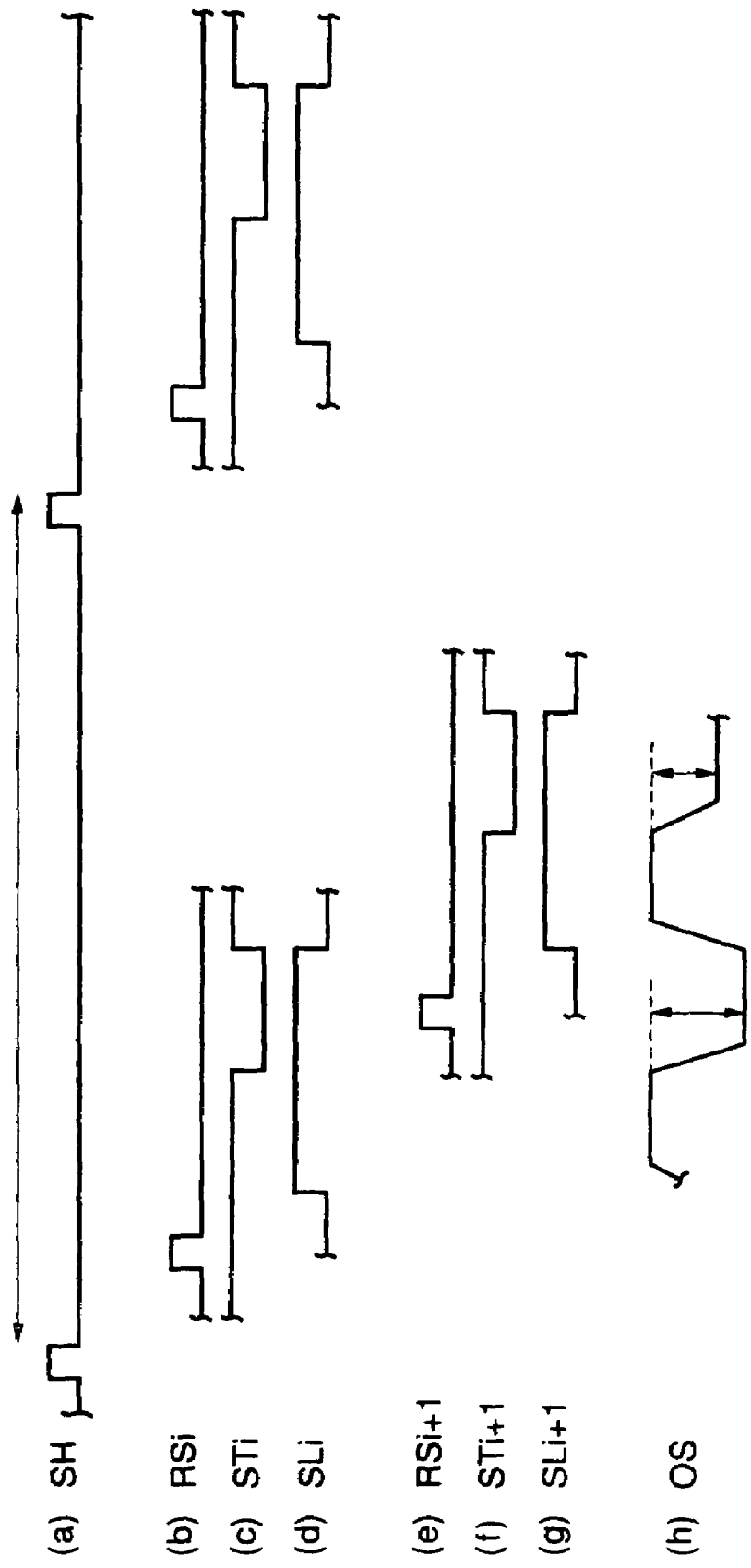
FIG. 3 is a timing chart showing an operation of the solid-state image pickup device of the first embodiment.
Figure 4:
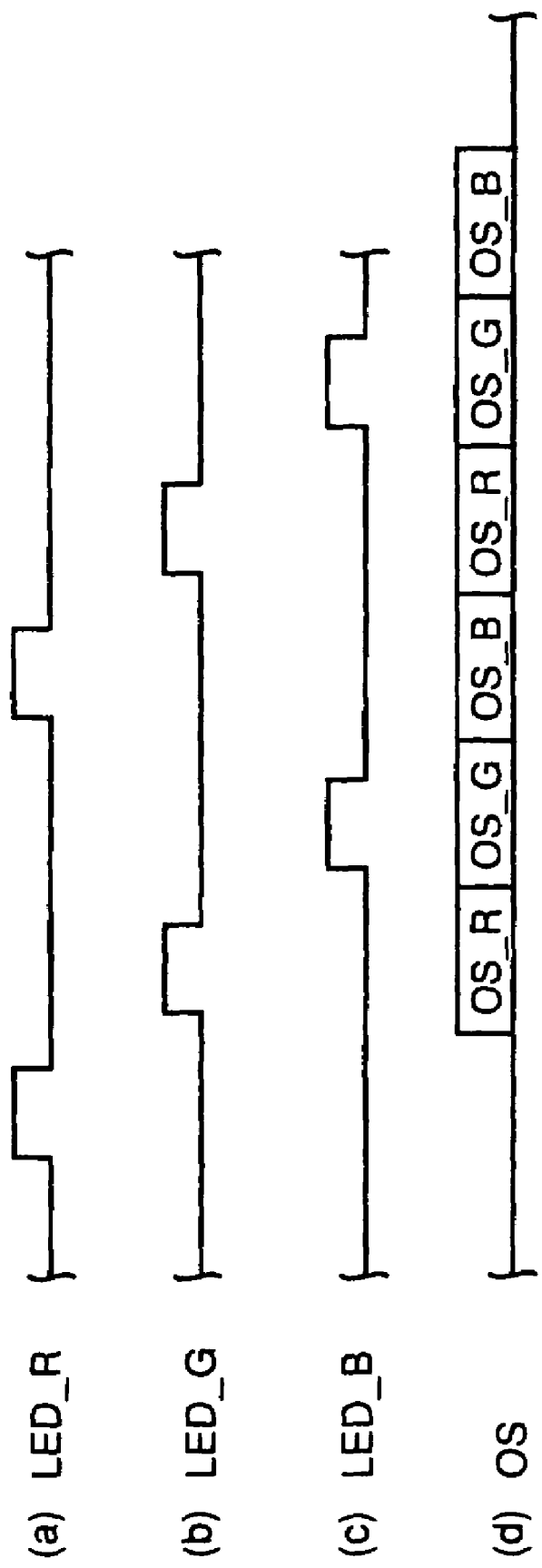
FIG. 4 is a timing chart showing an operation in a case where the solid-state image pickup device of the first embodiment is applied to a color light source.

Next, an operation of the solid-state image pickup device according to the first embodiment will be described with reference to a timing chart of FIG. 3. FIG. 3(a) shows a waveform of the pulse SH applied to the first electrode 16. When the pulse SH is applied, the first electrodes 16 are simultaneously opened, and the signal charges are temporarily stored in the second electrodes 17 for storing the electric charges. FIG. 3(b) shows pulses RSi applied to the reset gates 4. When the pulse RSi is applied to the reset gate 4, the drain 5 is allowed to conduct by the application of a reference voltage, and the potential of the floating diffusion layer 3 is set. FIG. 3(c) shows sequential pulses STi applied to the second electrodes 17 which function as storage sections, and FIG. 3(d) shows a selection pulse SLi generated by the shift register 8 in order to control a gate of the transistor 7 which selects a signal output of the buffer 6.

While an L level of the sequential pulse STi matches an H level of the selection pulse SLi, the stored signal charge is read via the buffer 9 like an output OS shown in FIG. 3(h). FIG. 3(e) shows a pulse RSi+1 applied to the reset gate 4 of the adjacent photosensitive pixel 1, FIG. 3(f) shows a sequential pulse STi+1 applied to the second electrode 17 of the charge transfer section 15 of the adjacent photosensitive pixel 1, and FIG. 3(g) shows a selection pulse SLi+1 generated by the shift register 8 in order to control the gate of the transistor 7 which selects the signal output of the buffer 6 of the adjacent photosensitive pixel 1.

As described above, the signal charge of the adjacent photosensitive pixel 1 is read via the buffer 9 like the output OS. It is to be noted that in FIG. 3(h), an intensity of the output of the signal charge read by the first (i) photosensitive pixel 1 is different from that of the signal charge read by the adjacent second (i+1) photosensitive pixel 1 as shown by arrows. This is because a quantity of light received by the photosensitive pixel 1 differs with each pixel, and therefore a difference is made in the intensity of the output in proportion to the quantity of received light.

The charge transfer sections 15 each of which is disposed for each photosensitive pixel 1 constituting the solid-state image pickup device are all opened by the pulses SH applied to the first electrodes 16 to read the signal charges with respect to all the photosensitive pixels 1. Thus, a storage time of the signal charge temporarily stored in the charge transfer section 15 becomes equal with respect to all the photosensitive pixels 1, and the stored signal charges can be successively read and output.

It is to be noted that FIGS. 4(a) to (d) show a relation between a lighting period and a readout period in a case where the solid-state image pickup device according to the first embodiment is applied to a color light source in the same manner as in FIGS. 27(a) to (d) in a conventional solid-state image pickup device. FIG. 4(a) is a timing chart of a pulse signal LED_R indicating the lighting time of red (R), FIG. 4(b) is a timing chart of a pulse signal LED_G indicating the lighting time of green (G), and FIG. 4(c) is a timing chart of a pulse signal LED_B indicating the lighting time of blue (B). As apparent from these figures, in the lighting time, the respective timings of the pulses of R, G, B deviate, but the output signals OS are continuously and successively output like OS_R, OS_G, and OS_B as shown in FIG. 4(d). Accordingly, the output signal OS can be sent regardless of the lighting time of each color of the color light source, and the readout period can be set regardless of the lighting period. Therefore, also in the lighting period of each color, the output signals OS can be successively and continuously output.

In the solid-state image pickup device according to the first embodiment, as shown in FIGS. 1 and 2, the first to third electrodes 16 to 18 of the charge transfer section 15 are formed by a single layer, and by the same layer as that of the reset gate 4 of the charge detection section 2. Therefore, the electrodes can be manufactured via only an insulation film (not shown) between them and the semiconductor substrate 20 by the same process, and a manufacturing process can be simplified. It is to be noted that as described above, trenches among the electrodes can be realized because the respective electrodes can be securely insulated from one another by a progress of a fine processing technique.

By a structure in which a plurality of electrodes constituting the charge transfer section 15 are formed by a single layer via fine gaps, a miniaturized solid-state image pickup device can be realized. When the structure is applied to a two-dimensional sensor mounted on a portable radio terminal, a digital camera or the like, an especially superior effect is produced.

In the solid-state image pickup device according to the first embodiment described with reference to FIGS. 1 to 4, it has been described that the plurality of electrodes of the charge transfer section 15 are formed by the single layer, but the present invention is not limited to the single-layer structure, and a plurality of electrodes may be formed by a multilayered structure.

Figure 5:
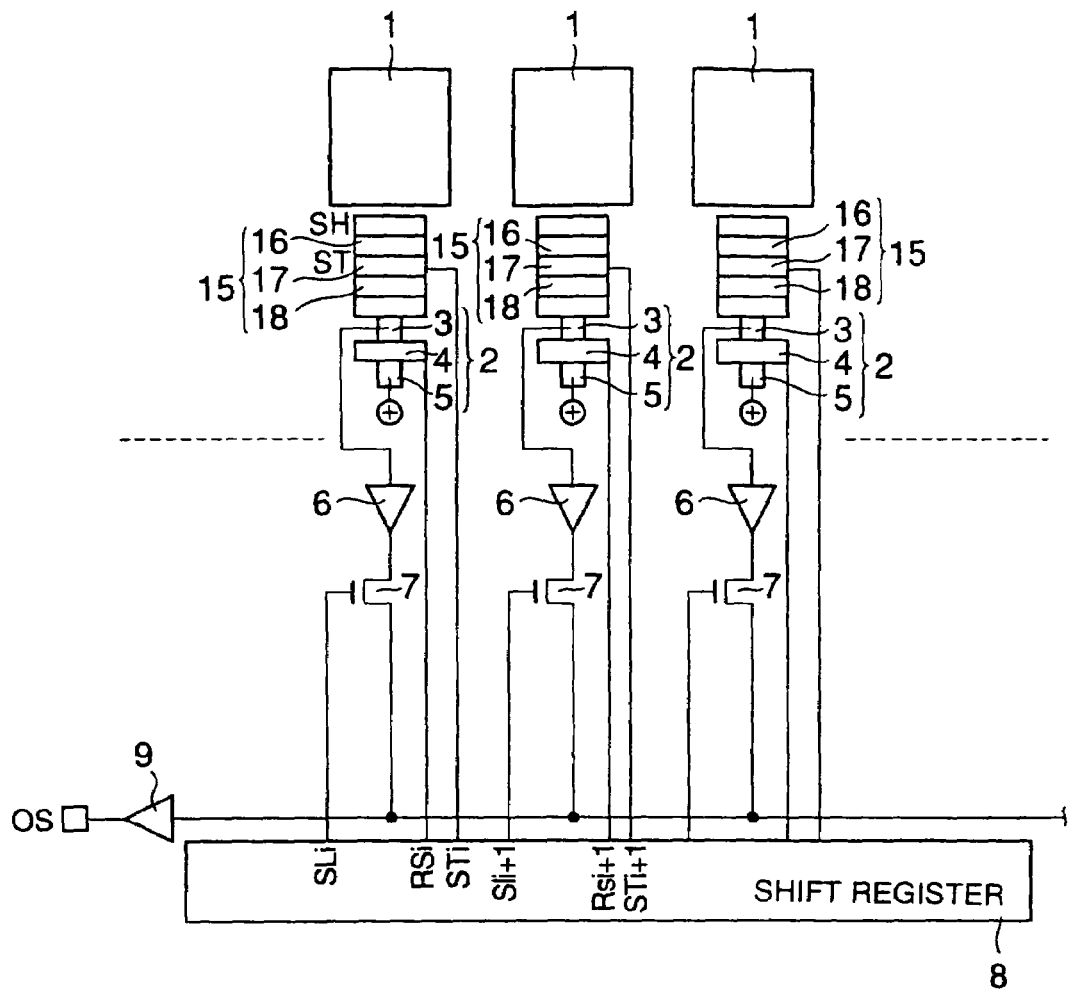
FIG. 5 is a circuit block diagram showing a schematic constitution of the solid-state image pickup device according to a second embodiment of the present invention.
Figure 6:
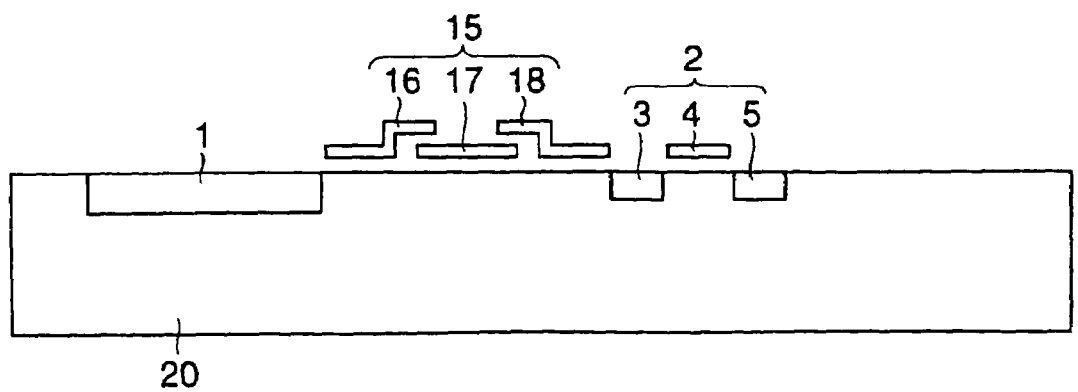
FIG. 6 is a schematic sectional view showing a sectional constitution of the solid-state image pickup device according to a second embodiment in which the first to third electrodes are formed in two layers.

In a solid-state image pickup device according to a second embodiment shown in FIGS. 5 and 6, two of a plurality of electrodes constituting the charge transfer section 15 disposed between the photosensitive pixel 1 and the charge detection section 2 are formed by a double-layer structure. In FIGS. 5 and 6, the first electrode 16 to which the pulse SH is applied and the third electrode 18 which functions as a bias electrode are raised, bent, and extended to form the double-layer structure in such a manner that facing opposite side edge portions of the second electrode 17 functioning as a charge storage electrode are covered.

As shown in detail in a sectional view of FIG. 6, the facing side edge portion of the first electrode 16 rises, bends, and extends to cover the side of the second electrode 17 on the side of the photosensitive pixel 1. The side edge portion of the facing third electrode 18 also rises, bends, and extends to cover the side of the second electrode 17 on the side of the charge detection section 2. Since an operation of the solid-state image pickup device according to the second embodiment including this constitution is the same as that of the first embodiment described with reference to FIGS. 3 and 4, redundant description is omitted.

According to the solid-state image pickup device of the second embodiment shown in FIG. 6 in which the electrodes positioned in the opposite ends of the plurality of electrodes constituting the charge transfer section 15 are constituted into two layers in such a manner as to cover the side edge portions of the inner electrode, there have been problems that manufacturing steps are slightly complicated and that a coupling capacitance between the electrodes also slightly increases. However, since fine gaps do not have to be formed in the double-layer structure, the structure has an advantage that the fine gaps do not have to be processed.

It is to be noted that the above has described the solid-state image pickup device according to the first and second embodiments in which the charge detection sections are disposed as many as the photosensitive pixels, but the present invention is not limited to this. When a charge transfer section for further temporarily storing the electric charge received by the photosensitive pixel, converted into the electric charge, and temporarily stored is disposed, the number of the photosensitive pixels does not have to be equal to that of charge detection sections. When the number of the charge detection sections is gradually decreased with respect to the photosensitive pixels, an image with a low resolution can be read at a high speed. Since a circuit area is reduced, a chip area can be reduced.

For example, the resolution is 300 dpi in a case where one charge detection section is disposed for eight pixels with respect to an image sensor having a resolution of 2400 dots per inch (dpi). The resolution is 150 dpi in a case where one charge detection section is disposed for 16 pixels. The resolution gradually decreases to ⅛, 1/16, but instead, the reading time can be speeded up an inverse number of times. A field of image processing which requires shortening of the reading time rather than the resolution of the image has spread in recent years. Therefore, the solid-state image pickup device according to an embodiment of the present invention in which the high-rate reading is possible is preferably applied to this field.

Figure 7:
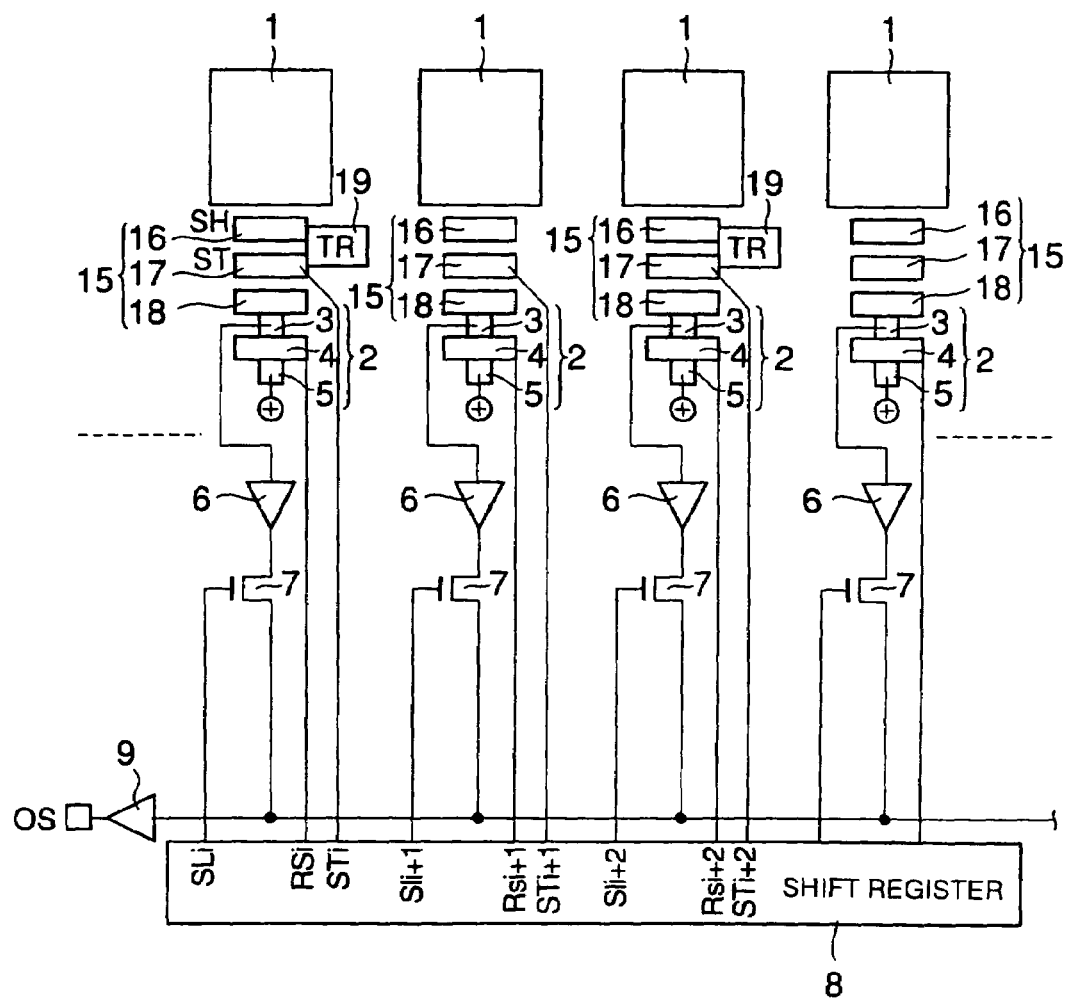
FIG. 7 is a circuit block diagram showing a schematic constitution of the solid-state image pickup device according to a third embodiment of the present invention.
Figure 8:
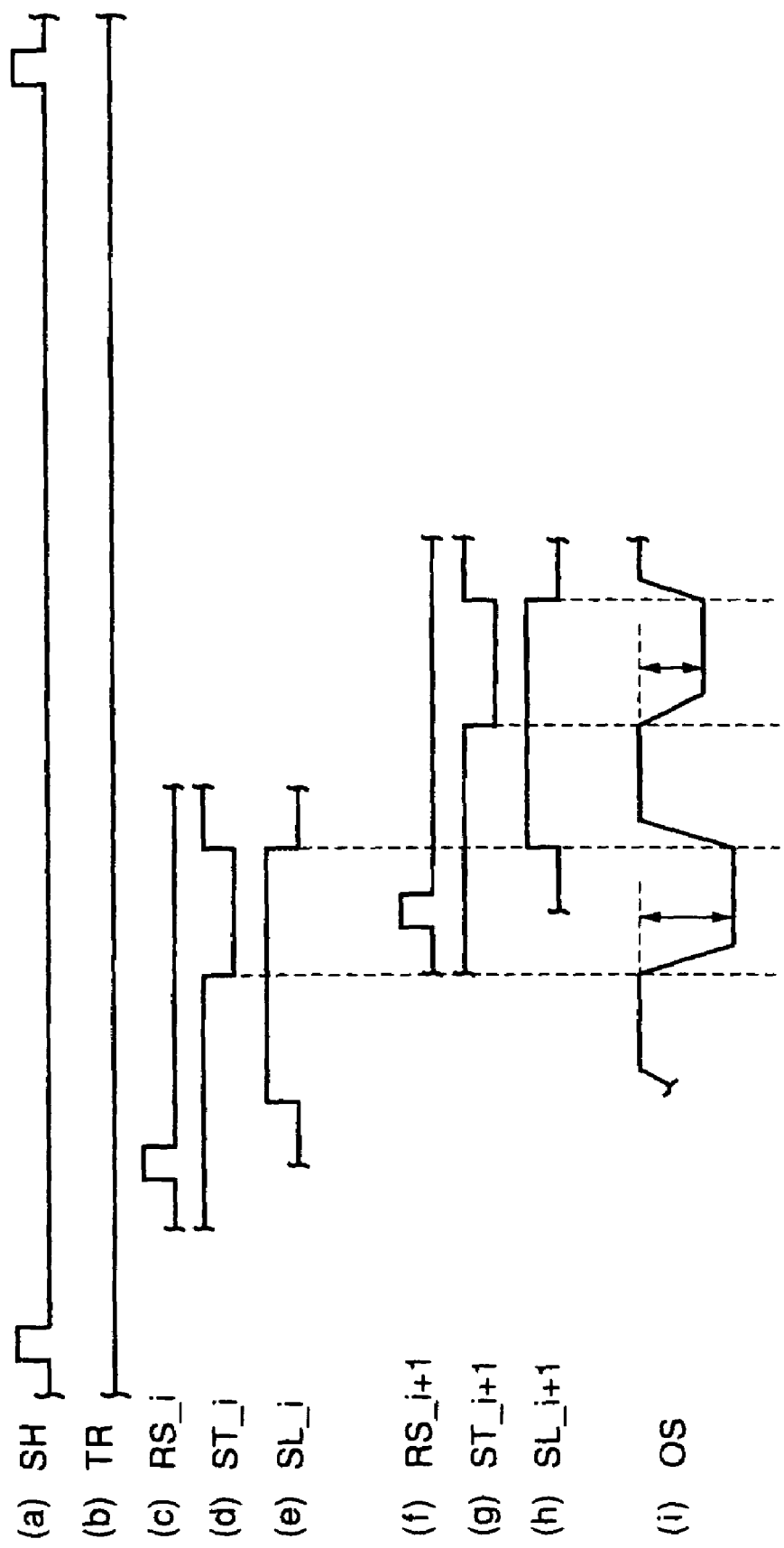
FIG. 8 is a timing chart showing an operation in a case where signal charges in the solid-state image pickup device of the third embodiment are read for each photosensitive pixel.
Figure 9:
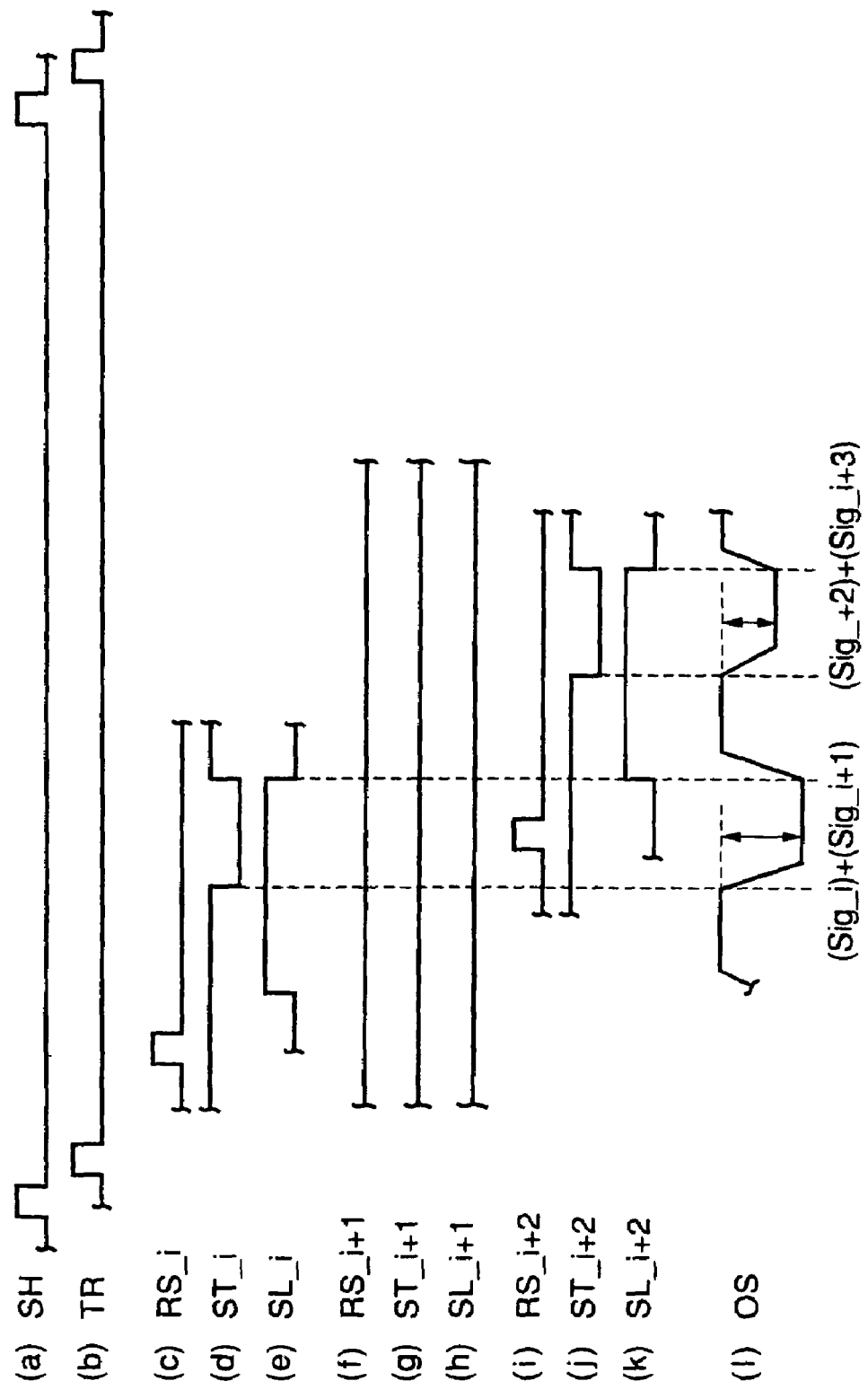
FIG. 9 is a timing chart showing an operation in a case where the signal charges in the solid-state image pickup device of the third embodiment are added up and read every two pixels.

A solid-state image pickup device according to third to ninth embodiments will be described with reference to FIGS. 7 to 17. FIGS. 7 to 9 show a schematic constitution and an operation of the solid-state image pickup device according to the third embodiment. In the constitution of FIG. 7, the elements denoted with the same reference numerals as those of the other embodiments show the same or corresponding constituting elements.

In FIG. 7, in the solid-state image pickup device according to the third embodiment, a fourth electrode 19 which is a transfer electrode (TR) is disposed between second electrodes 17 which function as storage electrodes of charge transfer sections 15 of two adjacent photosensitive pixels 1. To switch and read the resolution in a one-dimensional sensor, it is sometimes necessary to synthesize and output of signal charges of the adjacent photosensitive pixels 1. In this case, it is sometimes convenient to add up the signal charges of the adjacent photosensitive pixels and to convert the charges into output signals OS. In accordance with the convenience, the third embodiment may be used in a case where the signal charge stored in the photosensitive pixel 1 is read for each pixel or the signal charges of two adjacent pixels are synthesized and output.

An operation in either case will be described with reference to FIGS. 8 and 9. FIG. 8 shows a timing chart in a case where the signal charges from the adjacent photosensitive pixels 1 are read for each pixel without being joined. FIG. 9 is a timing chart showing an operation in a case where the first electrode 16 is simultaneously opened by the pulse SH to move the signal charge to the second electrode 17 which is a storage section. Thereafter, the fourth electrode 19 is operated, the signal charges stored in the second electrodes 17 of two adjacent photosensitive pixels 1 are combined, and read every two other pixels.

In the operation in the timing of FIG. 8, an operation similar to that described in the first and second embodiments using the first to third electrodes 16 to 18 is performed. That is, the first electrodes 16 open by the pulse SH shown in FIG. 8(a), and the signal charges stored in all the photosensitive pixels 1 are simultaneously stored in the second electrodes 17. In this case, since all the signal charges are read in the photosensitive pixel 1, any pulse does not rise in a signal TR into the fourth electrode 19 which is a transfer electrode as shown in FIG. 8(b).

FIGS. 8(c) to (e) show timings of a pulse RS_i output to the reset gate 4 of the photosensitive pixel on the left side of the fourth electrode 19 in the figure from the shift register 8, a pulse ST_i output to the second electrode 17, and a pulse SL_i output to the gate of the transistor 7. FIGS. 8(f) to (h) show timings of a pulse RS_i+1 output to the reset gate 4 of the photosensitive pixel on the right side of the fourth electrode 19 in the figure from the shift register 8, a pulse ST_i+1 output to the second electrode 17, and a pulse SL_i+1 output to the gate of the transistor 7. FIG. 8(i) shows a signal output OS. Thus, even a one-dimensional sensor including the fourth electrode 19 shown in FIG. 7 can perform a usual operation for reading the signal charge.

Next, the case where the signal charges of two adjacent photosensitive pixels 1 are read every two other pixels will be described with reference to FIGS. 9(a) to (i). After the output of the pulse SH shown in FIG. 9(a), a pulse TR into the fourth electrode 19 which is a transfer electrode rises as shown in FIG. 9(b), and then the signal charges stored in the second electrode which is a storage section on the left side of the fourth electrode 19 are first read as shown in FIGS. 9(c) to (e). Since any pulse does not rise in signals RS_i+1, ST_i+1, SL_i+1 into the charge transfer section 15 which is the photosensitive pixel on the right side of the fourth electrode 19 as shown in FIGS. 9(f) to (h), the signal charge of the pixel on the right side is not read alone, but is added to the signal charge of the photosensitive pixel on the left side, and read.

Since the charge transfer section 15 of the next photosensitive pixel 1 is on the left side of the fourth electrode 19, the section operates by the respective signal pulses shown in FIGS. 9(i) to (k), and the photosensitive pixel on the right side outputs the signal output OS to which the signal charge has been added up. When the signal TR is input into the fourth electrode 19 functions as the transfer electrode in this manner, the signal charges of two adjacent photosensitive pixels are added up and read when reading the signal charge of an odd-numbered pixel.

As described above, when the electric charges are added up in the charge transfer section 15, the area of the device is held to be substantially constant, and a signal noise ratio can be prevented from being deteriorated. The constitution for adding the electric charges is realized, when the charge transfer section 15 is disposed to temporarily store the signal charge of the photosensitive pixel 1 into the second electrode 17 which is the storage electrode of the charge transfer section. However, it is considerably difficult to realize the constitution in a circuit from the constitution of the conventional solid-state image pickup device shown in FIG. 25.

According to the solid-state image pickup device of the third embodiment, when the resolution needs to be switched for use as in the one-dimensional sensor, the pulse is raised in the signal TR into the fourth electrode 19 which is the transfer electrode. Accordingly, the device can be set in such a manner that only the signal charge from either of the adjacent photosensitive pixels is read. The device has a peculiar effect that the device can be effectively used in a configuration in which a reading rate is to be raised even if the resolution is lowered.

It is to be noted that in the third embodiment, the fourth electrode 19 is disposed, and accordingly the signal charge between two adjacent pixels is read every other pixel. However, when the device is mainly constituted in such a manner as to read the signal charge of only one of two adjacent pixels, a similar function/effect can be obtained even in a constitution in which one charge detection section 2 is disposed for two pixels instead of one pixel. As a concrete constitution example, a solid-state image pickup device according to a fourth embodiment will be described with reference to FIGS. 10 to 12.

Figure 10:
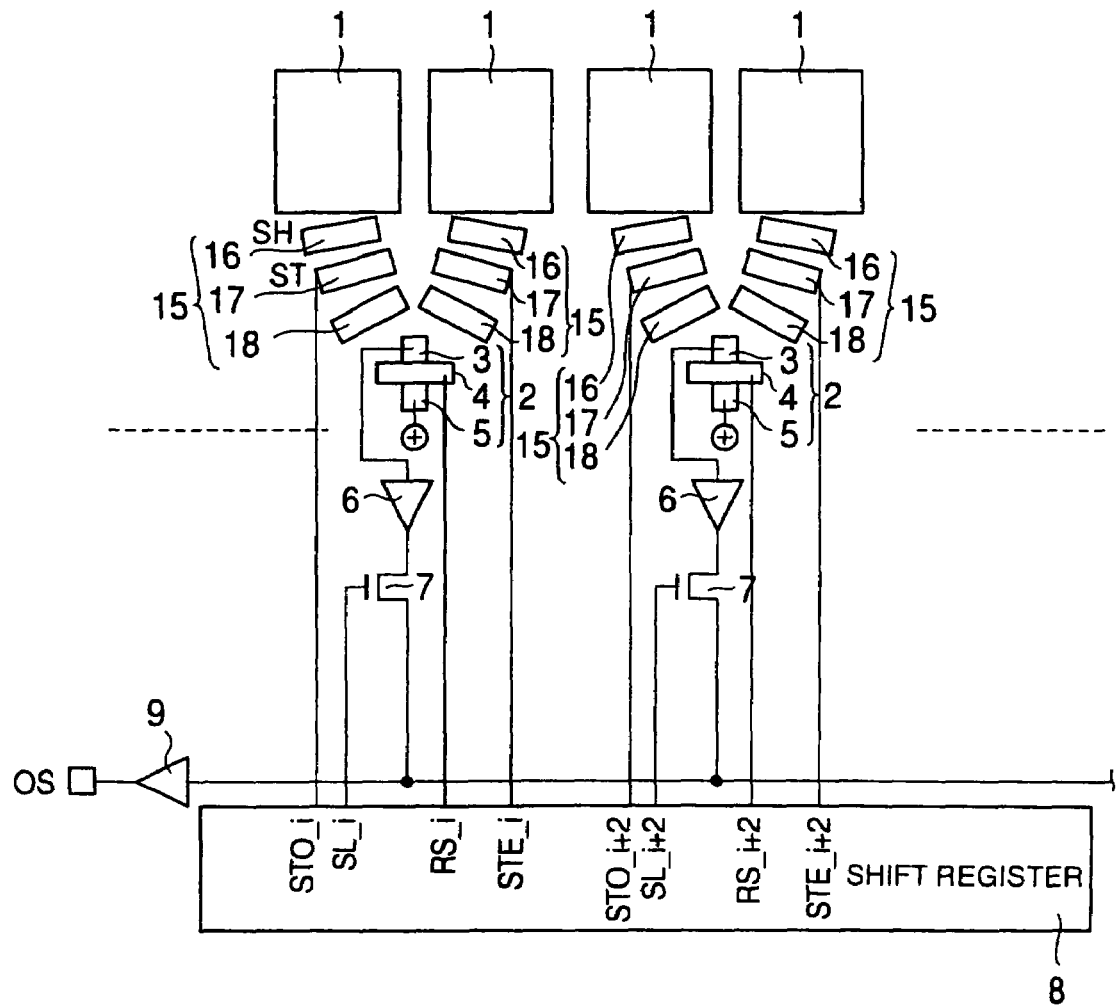
FIG. 10 is a circuit block diagram showing a schematic constitution of the solid-state image pickup device according to a fourth embodiment of the present invention.

In FIG. 10, in two adjacent photosensitive pixels 1, the charge transfer section 15 is disposed for each pixel as shown. The first to third electrodes 16 to 18 of each charge transfer section 15 are disposed in such a manner that the third electrodes 18 gradually approach each other in the charge transfer sections 15 constituting a pair. Each charge detection section 2 is disposed for two pixels between the third electrodes of the pair of charge transfer sections 15. Each buffer 6 for outputting the signal charge and each transistor 7 for performing a switching operation are also disposed every two pixels.

Figure 11:
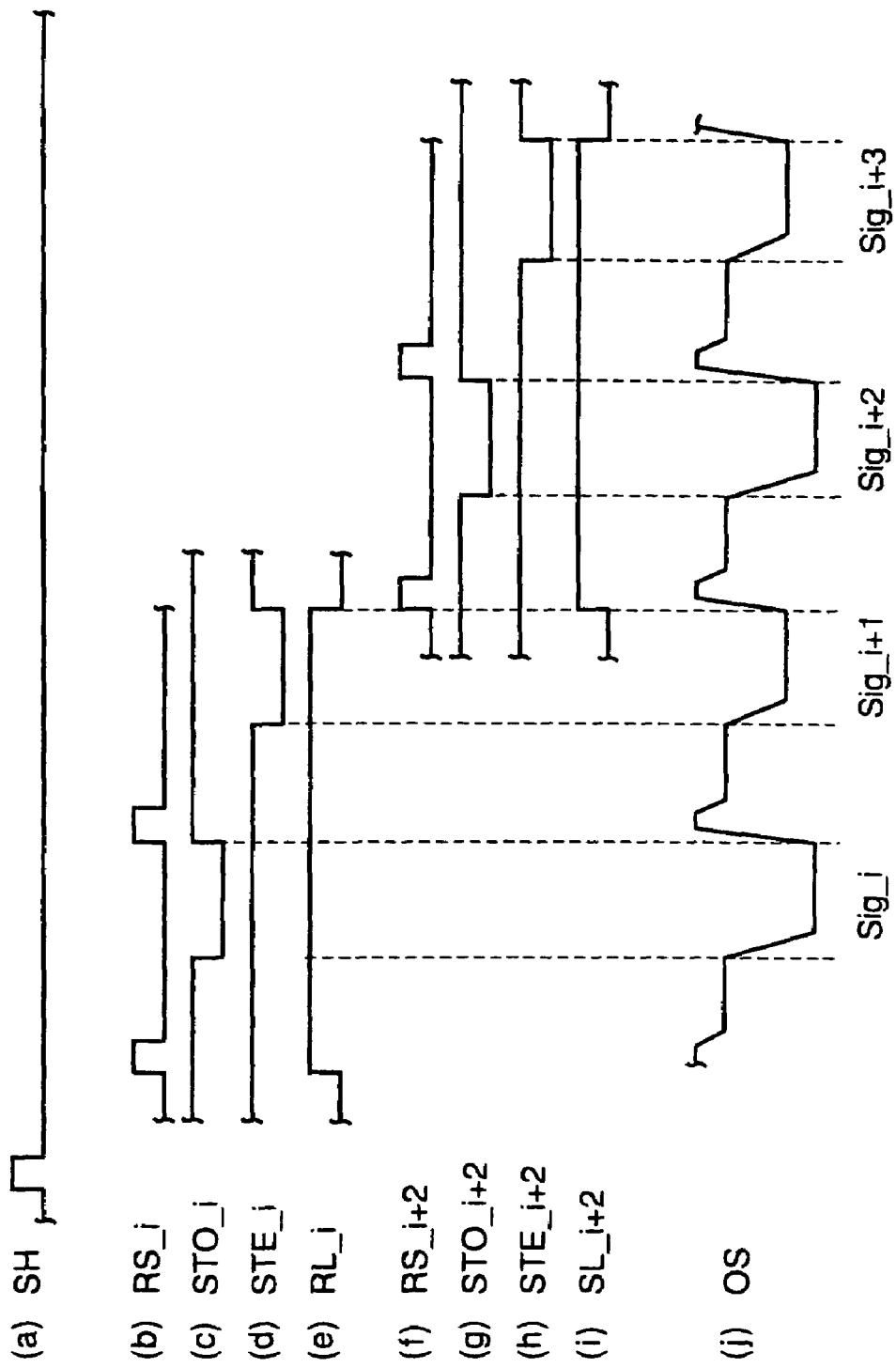
FIG. 11 is a timing chart showing an operation in a case where the signal charges in the solid-state image pickup device of the fourth embodiment are read for each photosensitive pixel.
Figure 12:
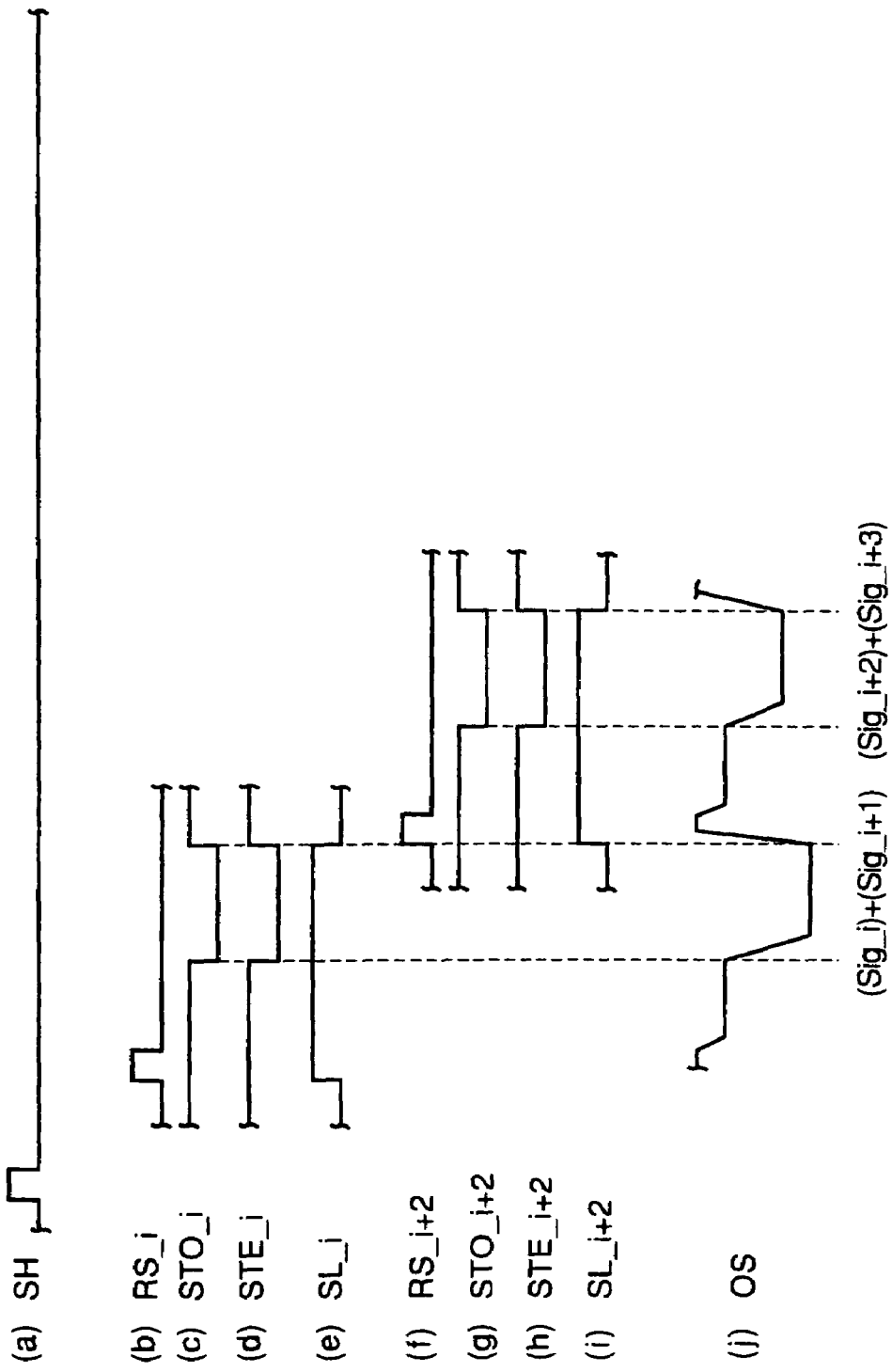
FIG. 12 is a timing chart showing an operation in a case where the signal charges in the solid-state image pickup device of the fourth embodiment are added up and read every two pixels.

An operation of the above-described constitution will be described with reference to FIGS. 11 and 12. FIG. 11 is a timing chart showing an operation for successively reading the signal charges with respect to all the photosensitive pixels 1, and FIG. 12 is a timing chart in a case where the signal charge of two adjacent photosensitive pixels 1 is read after adding each other. When the signal charges of two adjacent photosensitive pixels 1 are read by one charge detection section 2 as shown in FIGS. 11(a) to (j), signals SH are applied to the first electrodes 16 as shown in FIG. 11(a), and the signal charges of all the photosensitive pixels 1 are simultaneously read and stored in the second electrodes 17 that are storage sections. In pulses RS_i output to the reset gates 4 from the shift register 8, two pulses rise in a predetermined period as shown in FIG. 11(b).

Next, as shown in FIGS. 11(c), (d), by pulses STO_i output to the odd-numbered second electrodes 17 from the shift register 8, and pulses STE_i output to even-numbered second electrodes 17, the signal charges of odd-numbered and even-numbered photosensitive pixels 1 are read like Sig_i and Sig_i+1 in signal outputs OS shown in FIG. 11(j). Also in two photosensitive pixels shown on the right side in FIG. 10, Sig_i+2 and Sig_i+3 in the signal outputs OS of FIG. 11(j) are read by pulses including "i+2" attached thereto as shown in FIGS. 11(f) to (i) by a similar operation. Even when only one charge detection section 2 is disposed for two adjacent photosensitive pixels 1 as described above, the signal charges can be read with respect to all the photosensitive pixels 1.

Next, with reference to FIGS. 12(a) to (j), there will be described a case where the resolution is changed to read the signal charge of two adjacent photosensitive pixels 1 after adding each other. When each signal charge is successively read from two adjacent photosensitive pixels 1, and when pulses RS shown in FIG. 12(b) or (f) are set in such a manner as to rise once, the signal charges of the odd-numbered and even-numbered photosensitive pixels are simultaneously output and added up as shown in FIGS. 12(c), (d), (g), (h), and the signal charges of two adjacent photosensitive pixels are synthesized and output as shown by signal outputs OS in FIG. 12(j).

According to the solid-state image pickup device of the fourth embodiment described above, the circuits of the charge detection sections do not have to be disposed as many as the photosensitive pixels, as shown in FIGS. 1, 5, 7. As shown in FIG. 10, the number of circuit constitutions of charge detection sections can be decreased with respect to the number of the photosensitive pixels, and therefore there is an effect that a chip size of the whole solid-state image pickup device can be reduced.

In either of the solid-state image pickup devices according to the third and fourth embodiments, there has been described a concrete example in which the signal charge is successively read from two photosensitive pixels alone, or the signal charges are added up and read, but the present invention is not limited to this example. The number of the photosensitive pixels whose signal charges are read by one charge detection section 2 may be any number of three or more. Additionally, when the number of the photosensitive pixels disposed in the image sensor is, for example, 240, one charge detection section 2 is preferably disposed for each aliquot, e.g., 2, 3, 4, 8 or 16 of the photosensitive pixels. Several concrete examples of the number of the charge detection sections 2 will be described.

Figure 13:
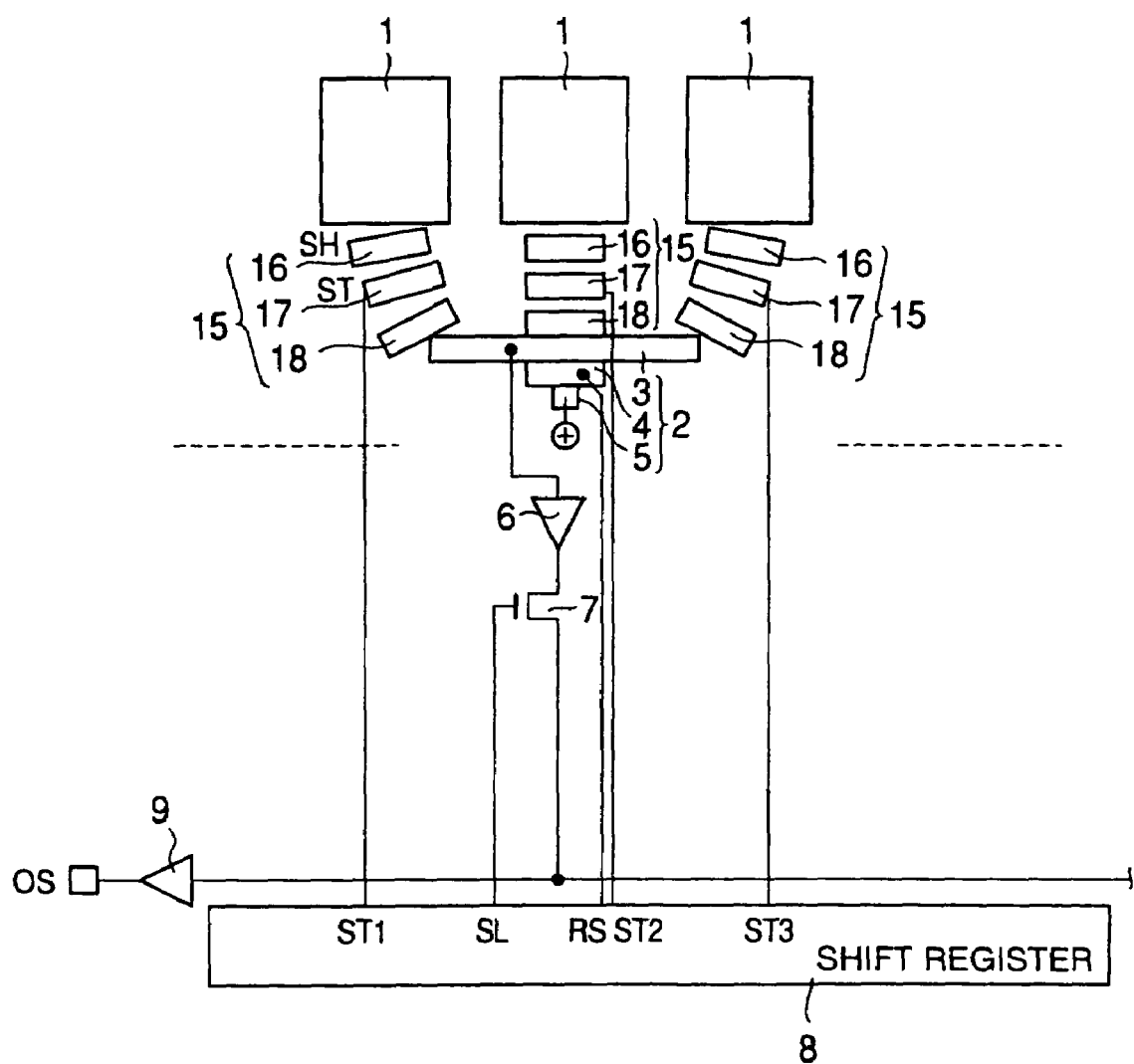
FIG. 13 is a circuit block diagram showing a schematic constitution of the solid-state image pickup device according to a fifth embodiment of the present invention in which one charge detection section is disposed in the pixel.

FIG. 13 shows a solid-state image pickup device according to a fifth embodiment in which the signal charges of three photosensitive pixels 1 are read at a time. In FIG. 13, signal charges read from three photosensitive pixels 1 and temporarily stored in charge transfer sections 15 of the pixels are read by one charge detection section 2 to output a signal output OS. When sequential pulses are used as reading pulses ST1, ST2, ST3 for the respective pixels, the signal charge may be read from each pixel. Alternatively, the signal charges for three pixels from the second electrodes 17 which are storage electrodes of the charge transfer sections 15 may be added up and output.

FIG. 14 shows a solid-state image pickup device according to a sixth embodiment in which signal charges of four photosensitive pixels are read at a time. In FIG. 14, the signal charges read from four photosensitive pixels 1 and temporarily stored in charge transfer sections 15 of the respective pixels are read by one charge detection section 2 to output a signal output OS. When sequential pulses are used as reading pulses ST1, ST2, ST3, ST4 for the respective pixels, the signal charge may be read from each pixel. Alternatively, the signal charges for four pixels from the second electrodes 17 which are storage electrodes of the charge transfer sections 15 may be added up and output.

Figure 15:
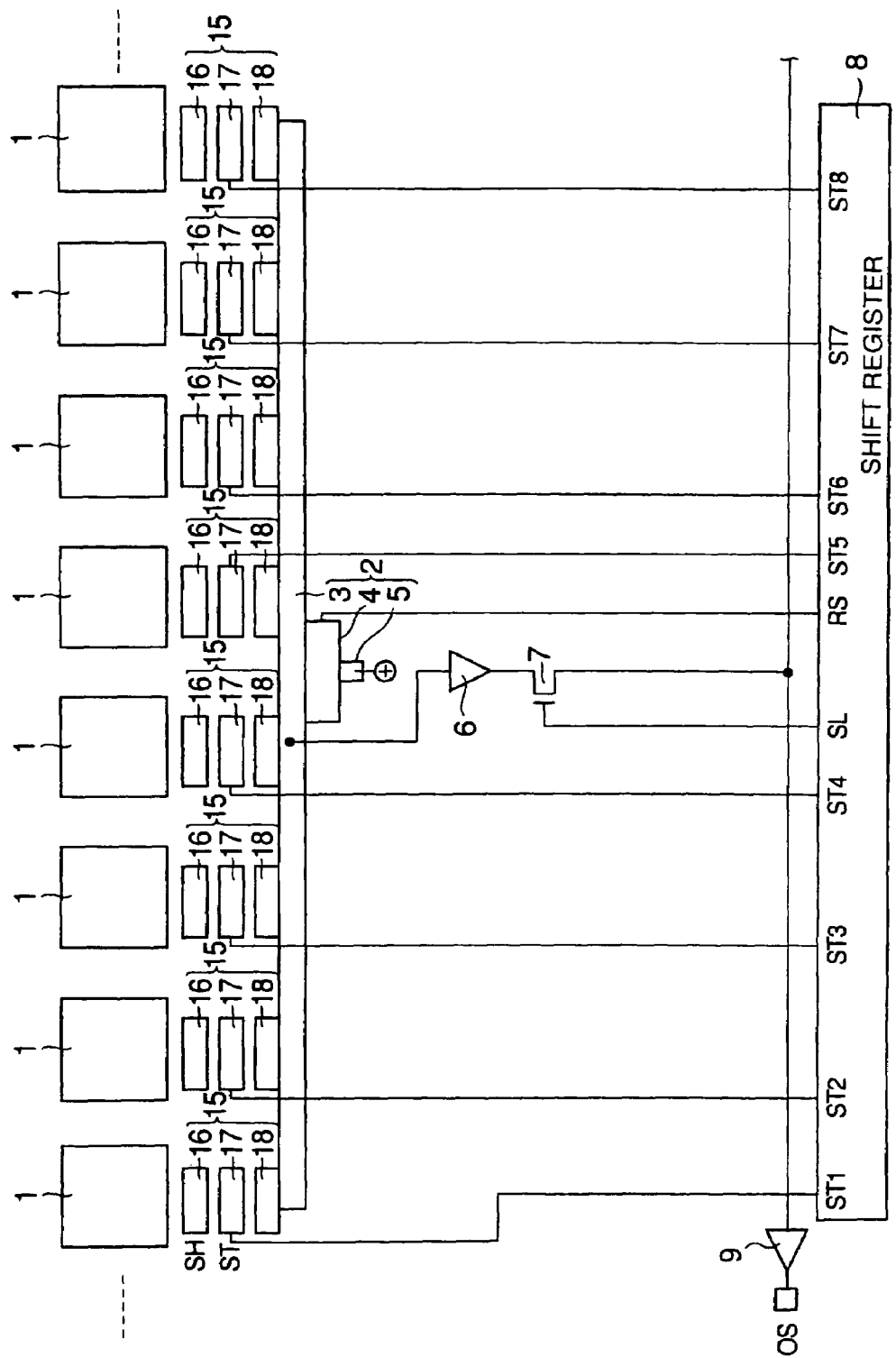
FIG. 15 is a circuit block diagram showing a schematic constitution of the solid-state image pickup device according to a seventh embodiment of the present invention in which one charge detection section is disposed for eight pixels.

FIG. 15 shows a solid-state image pickup device according to a seventh embodiment in which signal charges of eight photosensitive pixels are read at a time. In FIG. 15, the signal charges read from eight photosensitive pixels 1 and temporarily stored in charge transfer sections 15 of the respective pixels are read by one charge detection section 2 to output a signal output OS. When sequential pulses are used as reading pulses ST1 to ST8 for the respective pixels, the signal charge may be read from each pixel. Alternatively, the signal charges for eight pixels from the second electrodes 17 which are storage electrodes of the charge transfer sections 15 may be added up and output.

Figure 16:
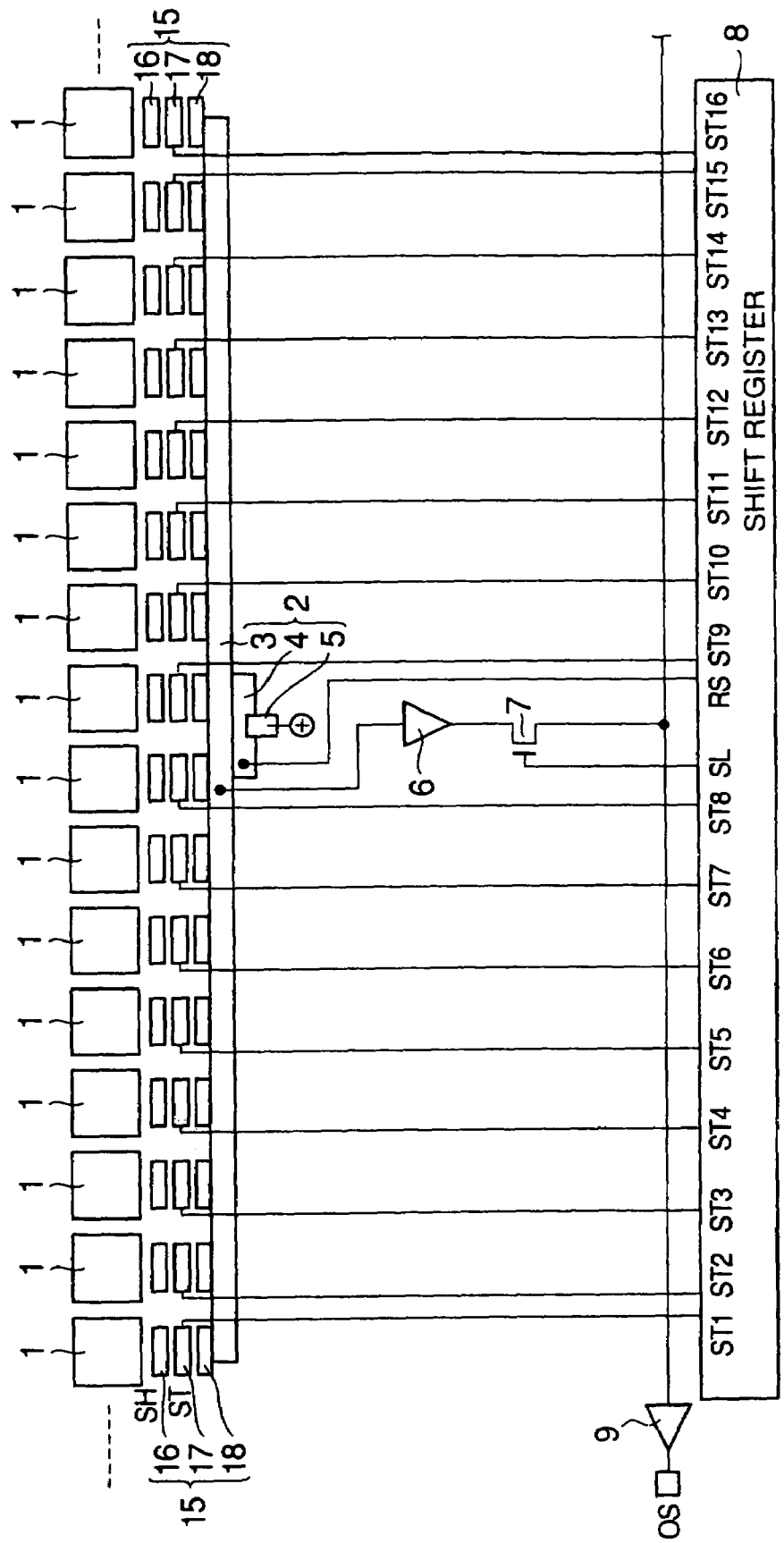
FIG. 16 is a circuit block diagram showing a schematic constitution of the solid-state image pickup device according to an eighth embodiment of the present invention in which one charge detection section is disposed for 16 pixels.

FIG. 16 shows a solid-state image pickup device according to an eighth embodiment in which signal charges of 16 photosensitive pixels are read at a time. In FIG. 16, the signal charges read from 16 photosensitive pixels 1 and temporarily stored in charge transfer sections 15 of the respective pixels are read by one charge detection section 2 to output a signal output OS. When sequential pulses are used as reading pulses ST1 to ST16 for the respective pixels, the signal charge may be read from each pixel. Alternatively, the signal charges for 16 pixels from the second electrodes 17 which are storage electrodes of the charge transfer sections 15 may be added up and output.

Figure 17:
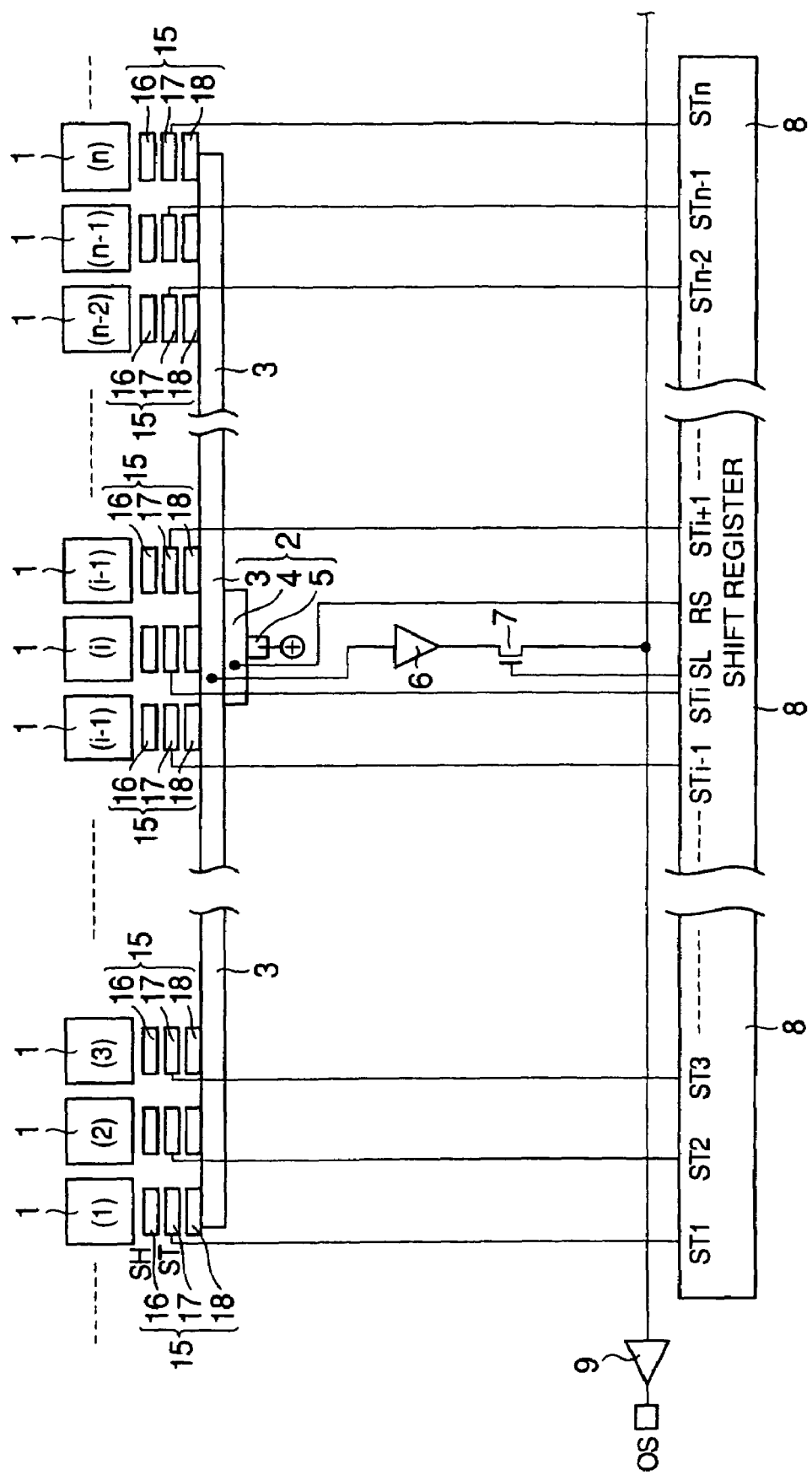
FIG. 17 is a circuit block diagram showing a schematic constitution of the solid-state image pickup device according to a ninth embodiment of the present invention in which one charge detection section is disposed for n pixels.

FIG. 17 shows a solid-state image pickup device according to a ninth embodiment in which signal charges of n photosensitive pixels are read at a time. In FIG. 17, the signal charges read from n photosensitive pixels 1 and temporarily stored in charge transfer sections 15 of the respective pixels are read by one charge detection section 2 to output a signal output OS. When sequential pulses are used as reading pulses ST1, ST2, ST3, . . . , STi−1, STi, STi+1, . . . , STn−2, STn−1, STn for the respective pixels, the signal charge may be read from each pixel. Alternatively, the signal charges for n photosensitive pixels from the second electrodes 17 which are storage electrodes of the charge transfer sections 15 may be added up and output.

Each of the solid-state image pickup devices according to the first to ninth embodiments is applied to any of one-dimensional sensors including plain paper copying machines and scanners, and accordingly there can be provided image sensors which are one-dimensional sensors. However, the present invention is not limited to the embodiments, and a charge detection section for adding and reading signal charges temporarily stored in charge transfer sections disposed for photosensitive pixels of a two-dimensional sensor every plurality of pixels may be disposed. Concrete examples of the two-dimensional sensor include a portable radio terminal including a camera attached thereto, a digital camera and the like which has prevailed in recent years.

Figure 18:
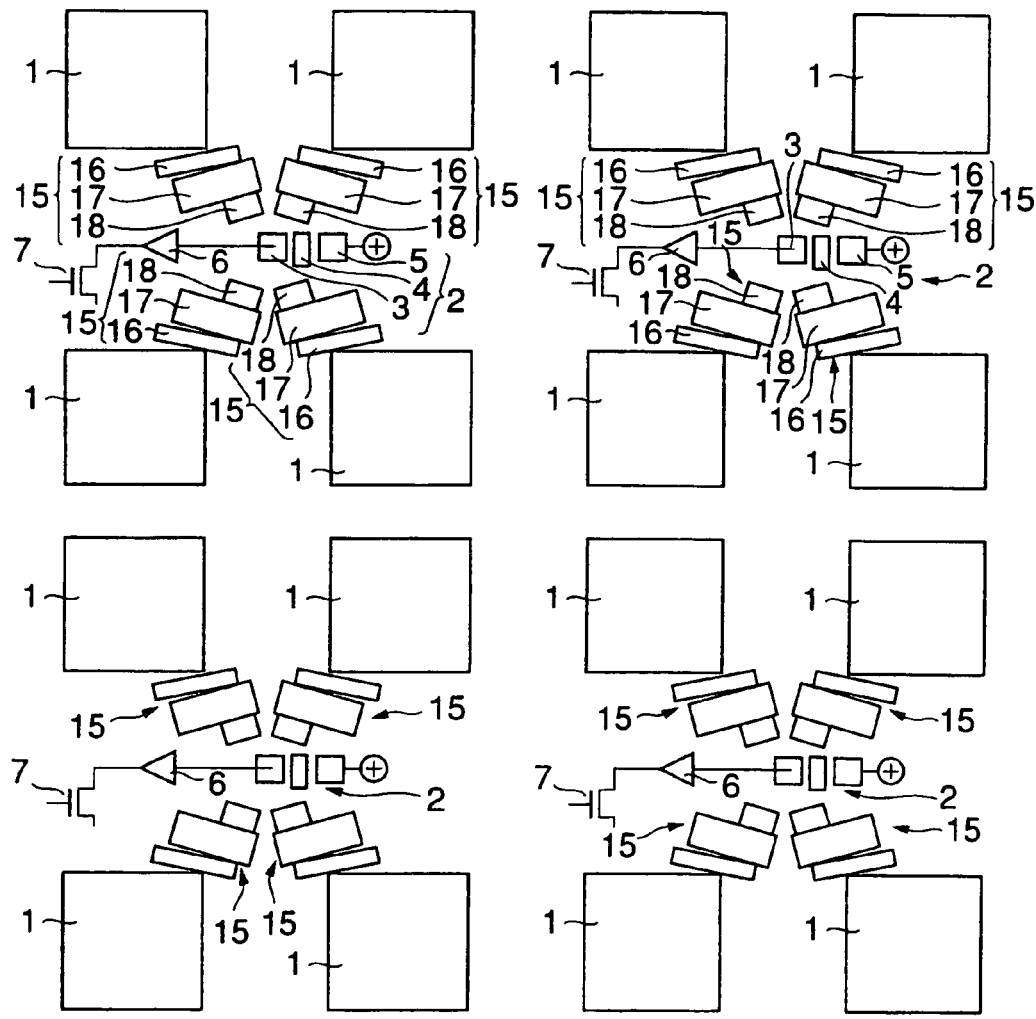
FIG. 18 is a constitution diagram showing a two-dimensional sensor according to a tenth embodiment of the present invention which is an application object of the solid-state image pickup device according to each of first to ninth embodiments and eleventh to fifteenth embodiments.

It is to be noted that concrete examples of a circuit constitution of the two-dimensional sensor include an image sensor to which solid-state image pickup device according to a tenth embodiment shown in FIG. 18 is applied. The image sensor according to the tenth embodiment will be described.

FIG. 18 is a block diagram showing the circuit constitution of the two-dimensional sensor. Pixels are linearly arranged in a one-dimensional sensor as shown in FIG. 1, whereas pixels 1 are arranged in XY-directions in a matrix form in the two-dimensional sensor as shown in FIG. 18. As shown, a charge transfer section 15 is disposed for each of four photosensitive pixels 1 arranged lengthwise and breadthwise among a large number of photosensitive pixels 1 arranged in the matrix form, and a charge detection section 2 is disposed in middle of four charge transfer sections 15. Each charge transfer section 15 includes first to third electrodes 16 to 18 in the same manner as in the first to ninth embodiments, and the charge detection section 2 includes a floating diffusion layer 3, reset gate 4, and drain 5. The signal charge stored in the floating diffusion layer 3 is output to a buffer 6, and output to a buffer (9) (not shown) by application of a selection pulse onto a transistor 7 to output a signal output OS (not shown).

Also in the two-dimensional sensor shown in FIG. 18, the signal charges temporarily stored in four photosensitive pixels 1 can be output to one charge detection section 2 at a time, the resolution of the two-dimensional sensor slightly lowers, but it becomes possible to read the signal charge detected by the two-dimensional sensor at a high speed. It is to be noted that as described in several embodiments of the one-dimensional sensor, also in the two-dimensional sensor, the number of the photosensitive pixels from which the signal charges are read at a time is not limited to 4. Accordingly, one charge detection section 2 may be disposed with respect to the desired number, e.g., 6, 8, 10, 12, 16 or 32 of the photosensitive pixels and the charge transfer sections 15 correspondingly disposed as many as the photosensitive pixels.

As described above, the solid-state image pickup device according to an embodiment of the present invention can be applied to not only the one-dimensional sensors according to the first to ninth embodiments but also the two-dimensional sensor according to the tenth embodiment. Even when the device is applied to any sensor, the device has superior adaptability in a case where a high resolution is not required but the signal charge is to be read in a short time at a high speed.

In any of the solid-state image pickup devices according to the first to ninth embodiments, it has been described that the charge detection section 2 includes the floating diffusion layer 3, reset gate 4, and drain 5. However, the present invention is not limited to this constitution, and the solid-state image pickup device may be realized using a charge coupled device (hereinafter abbreviated as CCD) instead of the charge detection section 2. Solid-state image pickup devices according to eleventh to sixteenth embodiments will be described hereinafter with reference to FIGS. 19 to 24.

Figure 19:
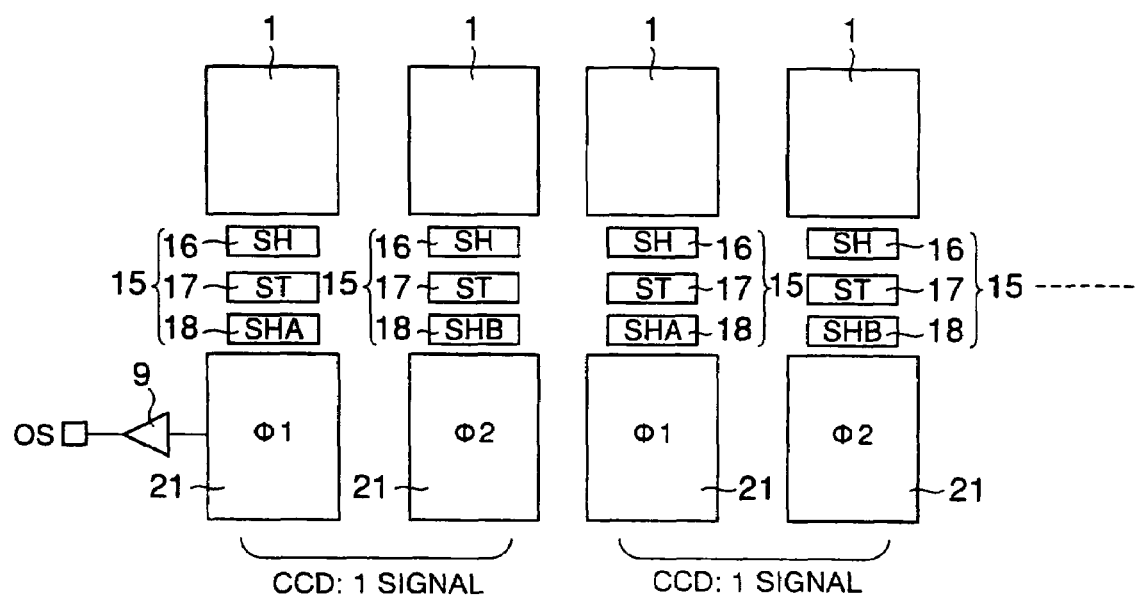
FIG. 19 is a block diagram showing a schematic constitution of the solid-state image pickup device according to the eleventh embodiment of the present invention.
Figure 20:
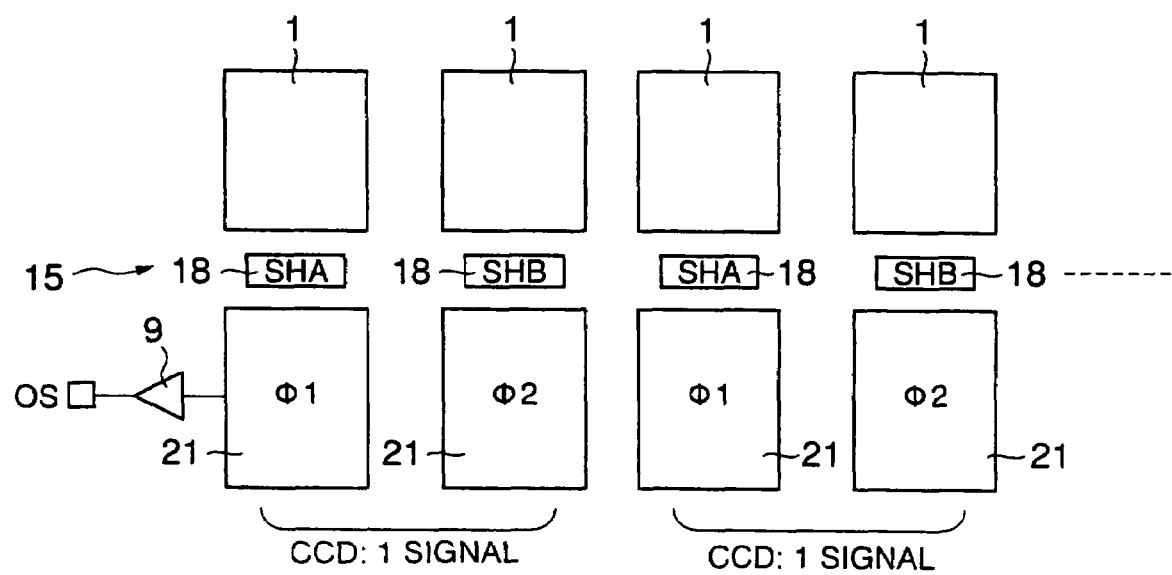
FIG. 20 is a block diagram showing a schematic constitution of the solid-state image pickup device according to a twelfth embodiment of the present invention.

FIG. 19 is a circuit block diagram showing the solid-state image pickup device according to the eleventh embodiment. In the figure, the charge detection section 2, buffer 6, transistor 7 and the like of FIG. 1 are replaced with a CCD 21 for each of the photosensitive pixels 1. The device is similar to that of FIG. 1 in that a signal output OS is output via a buffer 9. Although not shown, the solid-state image pickup device according to the eleventh embodiment is also a solid-state image pickup device: including a semiconductor substrate; a plurality of photosensitive pixels 1 for converting incident light on the semiconductor substrate into signal charges; CCDs 21 which are storage sections for temporarily storing the converted signal charges; and charge transfer sections 15 for successively transferring the signal charges after the signal charges from the CCDs 21 constituting the storage sections are transferred.

The solid-state image pickup device is characterized in a constitution in which the number of the signal charges transferable by the charge transfer sections 15 is smaller than the number of the CCDs 21 constituting the storage sections. Further in the eleventh embodiment, a plurality of signal charges are joined by either of the CCD 21 which is the storage section and the charge transfer section 15. In an example of FIG. 19, the signal charges of the photosensitive pixels 1 are joined by the CCD 21 which is the storage section. In FIG. 19, the signal charges of two CCDs 21, 21 are joined into one signal.

It is to be noted that in the solid-state image pickup device of the eleventh embodiment shown in FIG. 19, second electrodes 17 for temporarily storing the signal charges are disposed, and first electrodes 16 for transferring the signal charges of the photosensitive pixels 1 to the second electrodes 17 by pulse signals SH are disposed. In the constitution of the eleventh embodiment, the photosensitive pixels 1 may be used instead of the second electrodes 17 for storing the electric charges as in a twelfth embodiment shown in FIG. 20. In the twelfth embodiment shown in FIG. 20, each charge transfer section 15 is constituted of only a third electrode 18, and signal charges to be transferred are stored as such in photosensitive pixels 1.

Figure 21:
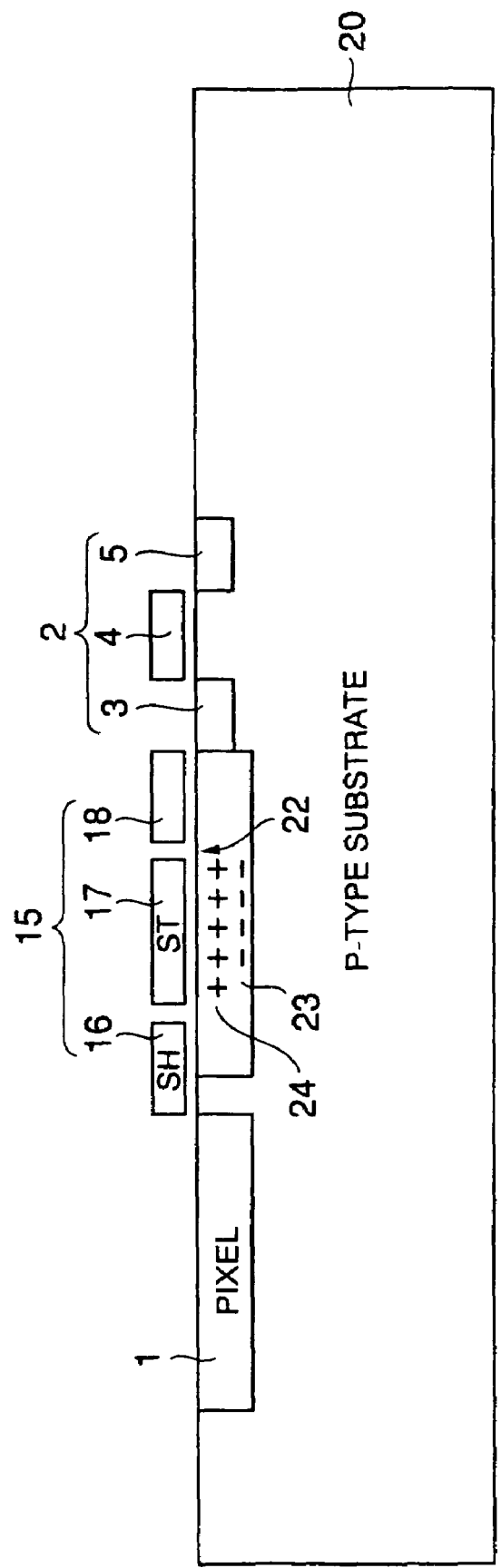
FIG. 21 is a schematic sectional view showing a sectional constitution of the solid-state image pickup device according to a thirteenth embodiment of the present invention.

A solid-state image pickup device according to a thirteenth embodiment will be described as a modification of the eleventh and twelfth embodiments with reference to FIG. 21. In the thirteenth embodiment, as shown in FIG. 21, when a signal charge is stored into a storage section such as a CCD 21 or a second electrode 17, a minus (−) voltage is applied to the second electrode 17, and an electric charge 24 of a conductive type (+) opposite to that of a stored signal charge 23 (minus signal charge, i.e., electron in a shown case) is stored in an interface 22 of a semiconductor constituting the storage section.

That is, when the minus voltage is applied to the second electrode 17, a hole 24 is stored in the interface 22. In this constitution, a level of the interface 22 is filled with the hole 24, and a dark current (generated recombined current) decreases.

Figure 22:
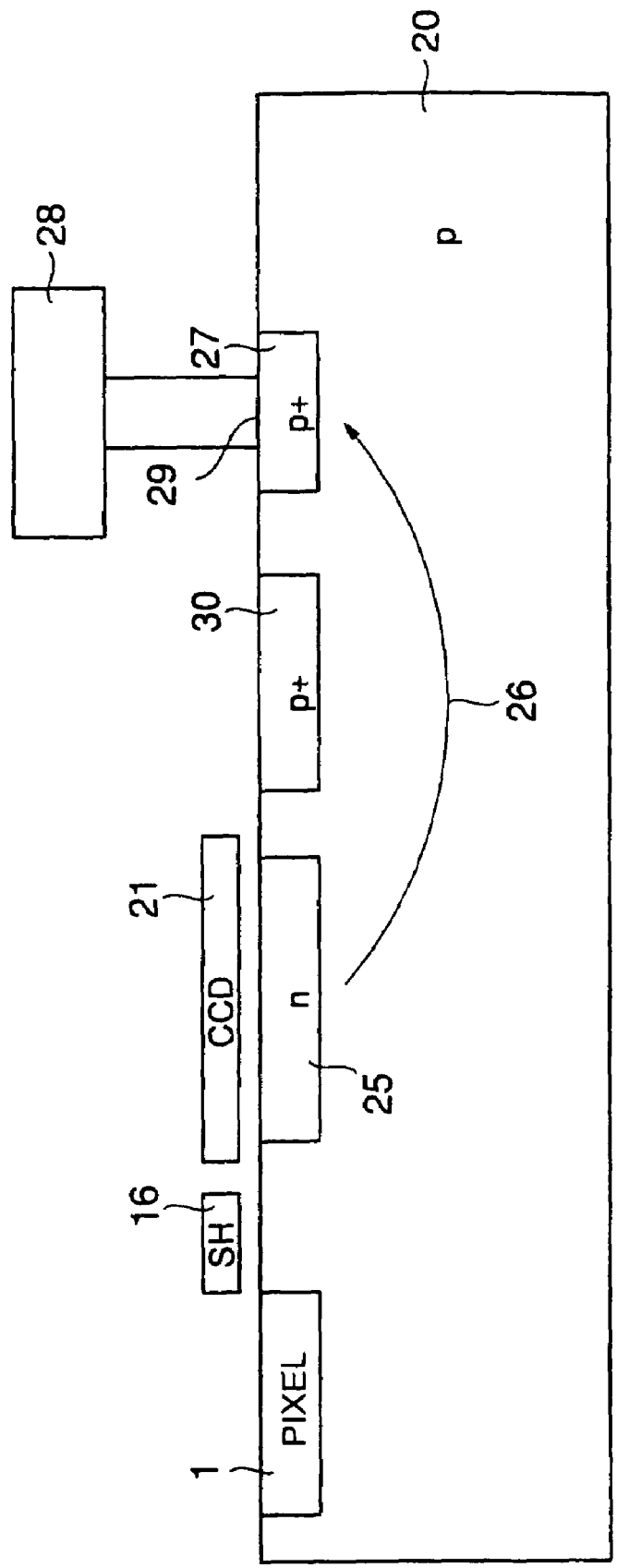
FIG. 22 is a schematic sectional view showing a sectional constitution of a solid-state image pickup device which is a conventional example of the fourteenth and fifteenth embodiments.

It is to be noted that in a sectional structure of a conventional solid-state image pickup device, as shown in FIG. 22, a photosensitive pixel 1 is formed in the surface of a semiconductor substrate 20 having, for example, a p-type conductivity which is a first conductive type, and a first electrode 16 and a CCD 21 which is a storage section are formed in the same layer via an insulation film (not shown). A first impurity region 27 having, for example, a p-type conductivity is formed adjacent to a region of the semiconductor substrate 20 in which the photosensitive pixel 1 is formed, and a charge transfer section 25 is formed facing the CCD 21 between the first impurity region 27 and the pixel 1.

In the constitution shown in FIG. 22, the charge transfer section 25 has, for example, a n-type conductivity which is a second conductive type. A power wiring 28 for supplying a predetermined voltage to the first impurity region 27 is disposed facing the first impurity region 27, and a contact portion 29 for connecting the power wiring 28 to the first impurity region 27 is disposed. A second impurity region 30 which has the same conductive type as that of the first impurity region 27 and whose impurity concentration is higher than that of the first impurity region 27 and which functions as a device isolating region is disposed between the charge transfer section 25 and the first impurity region 27.

According to the constitution of the conventional solid-state image pickup device shown in FIG. 22, a charged/discharged current based on a capacitance of the CCD 21 flows into the contact portion 29 and first impurity region 27 which constitute a substrate voltage supply line from the charge transfer section 25 disposed facing the CCD 21 on the side of the substrate 20 as shown by an arrow 26. Thus, while the concentration of p-type impurities of the contact portion 29 is high, the concentration of impurities of the first impurity region 27 sometimes lowers, for example, because the first impurity region also functions as the device isolating region. When the impurity concentration of the first impurity region is low, a contact resistance increases, and much time is required for the charged/discharged current from the CCD 21 to pass as shown by the arrow 26. Therefore, there has been a problem that a substrate potential is vibrated and noises appear in an output signal.

Figure 23:
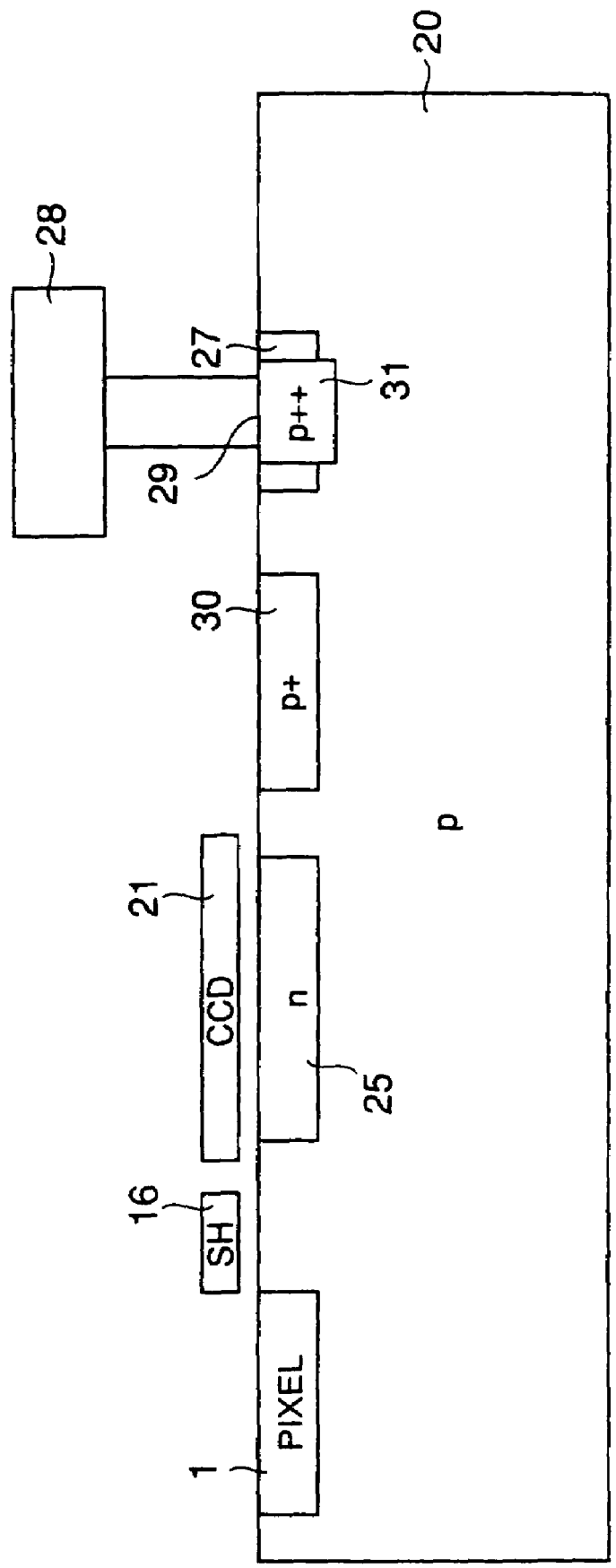
FIG. 23 is a schematic sectional view showing a sectional constitution of the solid-state image pickup device according to the fourteenth embodiment of the present invention.

To solve the above-described problem, a solid-state image pickup device according to a fourteenth embodiment has been described. As shown in FIG. 23, the device includes: a semiconductor substrate 20; a charge transfer section 25 disposed in a first impurity region 27 having a first conductive type (e.g., p-type) of the semiconductor substrate 20; a power wiring 28 fir supplying a predetermined voltage to the first impurity region 27; a contact portion 29 which connects the power wiring 28 to the first impurity region 27; a second impurity region 30 which has the same conductive type (e.g., the p-type) as that of the first impurity region 27 and whose concentration is higher than that of the first impurity region 27 and which functions as a device isolating region; and a third impurity region 31 which has the same conductive type (e.g., the p-type) as that of the second impurity region 30 and whose impurity concentration is higher than that of the second impurity region 30 and which is disposed under the contact portion 29.

In the solid-state image pickup device according to the fourteenth embodiment shown in FIG. 23, the third impurity region 31 which is a high-concentration impurity region is disposed under the contact portion 29, and therefore the device has a peculiar effect that a contact resistance from the semiconductor substrate 20 to the contact portion 29 can be lowered.

Figure 24:
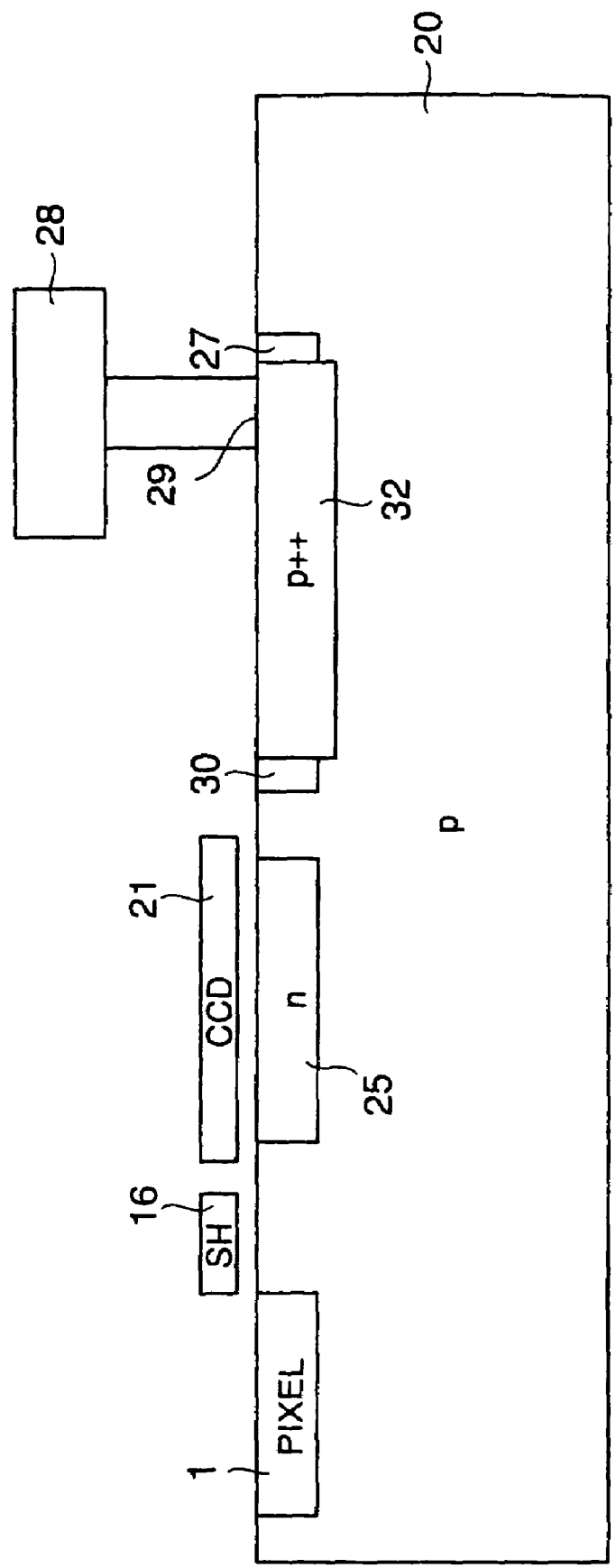
FIG. 24 is a schematic sectional view showing a sectional constitution of the solid-state image pickup device according to the fifteenth embodiment of the present invention.
Figure 26:
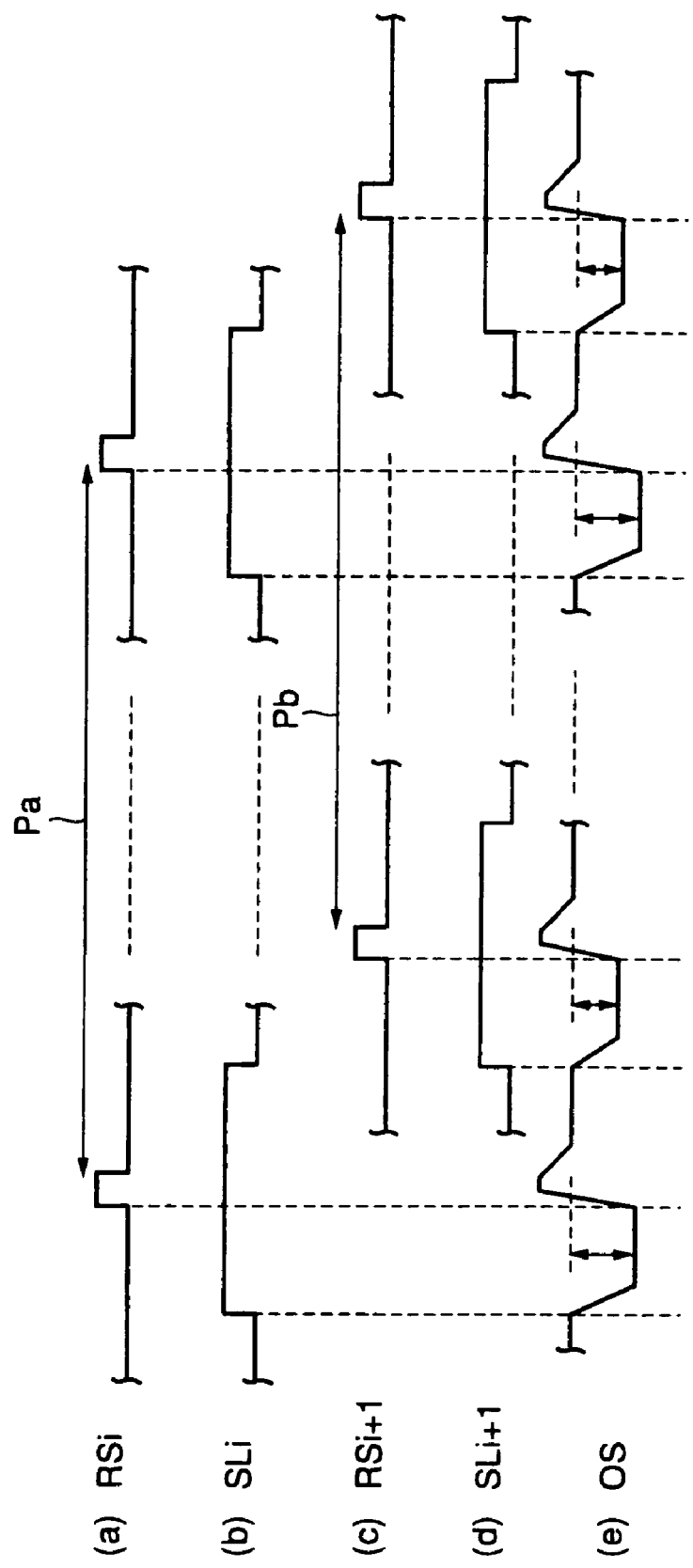
FIG. 26 is a waveform diagram showing a first signal readout operation example of the solid-state image pickup device shown in FIG. 25.
Figure 27:
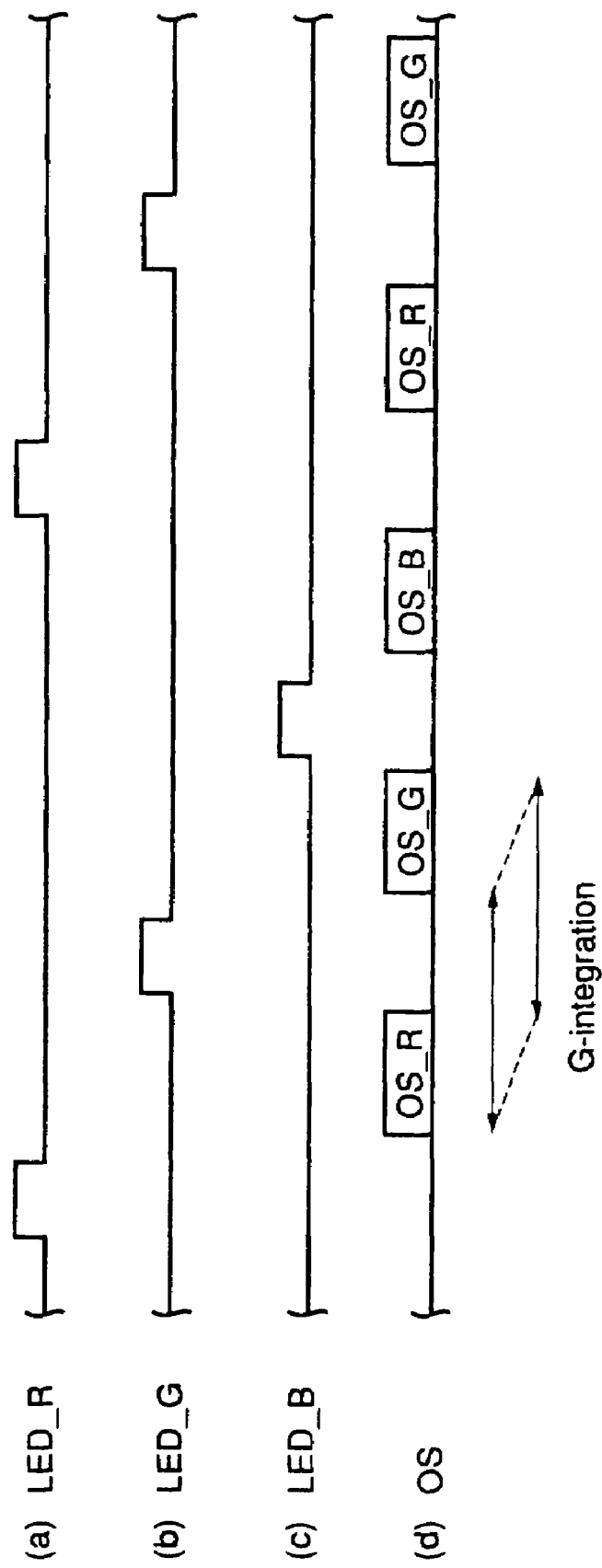
FIG. 27 is a waveform diagram showing a second signal readout operation example of the solid-state image pickup device shown in FIG. 25.

It is to be noted that in the solid-state image pickup device according to the fourteenth embodiment shown in FIG. 23, the third impurity region 31 is formed only under the contact portion 29, but further to decrease the contact resistance in such a manner that the charged/discharged current easily flows, a third impurity region 32 may be disposed between the contact portion 29 and the charge transfer section 25 as in a solid-state image pickup device according to a fifteenth embodiment shown in FIG. 24. In the fifteenth embodiment, the third impurity region 32 is extended/disposed from a first impurity region 27 over to a second impurity region 30, and its extending range extends between a contact portion 29 and a charge transfer section 25.

When the third impurity region 32 is also disposed between the contact portion 29 and charge transfer section 25 as in the solid-state image pickup device according to the fifteenth embodiment shown in FIG. 24, a contact resistance is further lowered. Additionally, the device has a peculiar effect that a charged/discharged current based on a capacitance of a CCD 21 further easily flows from the CCD 21 via the charge transfer section 25 as shown by the arrow 26 of FIG. 22.

As described above, even when the solid-state image pickup devices according to the first to fifteenth embodiments are applied to the one-dimensional sensor shown in FIG. 1 and the like or the two-dimensional sensor shown in FIG. 18, the devices have functional characteristics that either image sensor is superior and has a low resolution, and the signal charge can be read at a high speed.

As described above, according to the solid-state image pickup device of the embodiments, the charge coupled device for storing/transferring the second conductive types is disposed between the photosensitive pixel and the charge detection section in the solid-state image pickup device which selects and outputs the output of the charge detection section disposed in the photosensitive pixel. Accordingly, simultaneity of a storage time and an addition function of signal charges can be realized with low noise and by a small circuit area.

What is claimed is:

1. A solid-state image pickup device comprising:
   a semiconductor substrate,
   a plurality of photosensitive pixels each of which converts incident light on the semiconductor substrate into a converted signal charge,
   a charge detection section which converts the converted signal charge into an output signal and
   a plurality of charge transfer sections disposed between respective of the photosensitive pixels and the charge detection section and which temporarily stores the converted signal charge and which selectively transfers the converted signal charge to the charge detection section by application of sequential pulses,
   wherein one charge transfer section only transfers a charge of a corresponding one photosensitive pixel, and
   the charge transfer sections transfer and selectively output the signal charge, one by one, of a photosensitive pixel included in the plurality of photosensitive pixels.

2. The solid-state image pickup device according to claim 1, wherein the charge transfer sections each comprise a plurality of electrodes disposed on the semiconductor substrate via an insulation film.

3. The solid-state image pickup device according to claim 2, wherein the charge transfer sections each comprise:
   a first electrode adjacent to the corresponding photosensitive pixel, a second electrode as a storage electrode which temporarily stores the signal charge, and a third electrode which is disposed between the second electrode and the charge detection section and which functions as a bias electrode.

4. The solid-state image pickup device according to claim 2, wherein the plurality of electrodes are disposed in the same layer via an insulation film and are separated from one another by fine gaps.

5. The solid-state image pickup device according to claim 2, wherein each of the plurality of electrodes has a double-layer structure in which main body portions of the electrodes are disposed in the same layer via the insulation film, and a side of the other electrode facing the side of one of adjacent electrodes is raised, bent, extended, and superposed upon the electrode via the insulation film.

6. The solid-state image pickup device according to claim 1, wherein the charge detection sections and the charge transfer sections are disposed, corresponding to the photosensitive pixels, respectively, as many as the number of the photosensitive pixels.

7. The solid-state image pickup device according to claim 1, wherein the plurality of charge transfer sections are disposed, corresponding to the plurality of photosensitive pixels, respectively, as many as the photosensitive pixels, and a plurality of charge detection sections are each disposed to each of the plurality of charge transfer sections.

8. The solid-state image pickup device according to claim 7, wherein the n charge transfer sections are disposed corresponding to the n photosensitive pixels, and one charge detection section is disposed every n charge transfer sections.

9. The solid-state image pickup device according to claim 8, wherein the n denotes one number selected from the group consisting of 2, 3, 4, 8 and 16, and one charge detection section is disposed with respect to any number of the charge transfer sections.

10. The solid-state image pickup device according to claim 1, wherein one photosensitive pixel, one charge transfer section and one charge detection section make one pickup set, and a plurality of pickup sets form the solid-state image pickup device.

11. The solid-state image pickup device according to claim 1, wherein two photosensitive pixels, two charge transfer sections and one charge detection section make one pickup set, and a plurality of pickup sets from the solid-state image pickup device.

12. The solid-state image pickup device according to claim 1, wherein three photosensitive pixels, three charge transfer sections and one charge detection section make one pickup set, and a plurality of pickup sets from the solid-state image pickup device.

13. The solid-state image pickup device according to claim 1, wherein four photosensitive pixels, four charge transfer sections and one charge detection section make one pickup set, and a plurality of pickup sets form the solid-state image pickup device.

14. The solid-state image pickup device according to claim 1, wherein eight photosensitive pixels, eight charge transfer sections and one charge detection section make one pickup set, and a plurality of pickup sets form the solid-state image pickup device.

15. The solid-state image pickup device according to claim 1, wherein sixteen photosensitive pixels, sixteen charge transfer sections and one charge detection section make one pickup set, and a plurality of pickup sets form the solid-state image pickup device.

16. A solid-state image pickup device comprising:
a semiconductor substrate,
a plurality of photosensitive pixels which converts incident light on the semiconductor substrate into signal charges,
storage sections which temporarily store the converted signal charges, and
a charge transfer section which is disposed between the photosensitive pixels and the storage sections and which successively transfers the signal charge after the signal charge is transferred from each of the storage sections,
wherein the number of the signal charges which can be transferred by the charge transfer section is smaller than that of the pixels and at least the photosensitive pixel and the charge transfer section have the same number, respectively, and one charge transfer section only transfers a charge of a corresponding one photosensitive pixel, and
the charge transfer section transfers and selectively outputs the signal charge, one by one, of a photosensitive pixel included in the plurality of photosensitive pixels.

17. The solid-state image pickup device according to claim 16, wherein the plurality of signal charges are joined by either of the storage section and the charge transfer section.

18. The solid-state image pickup device according to claim 16, wherein electric charges having a polarity opposite to that of the stored signal charges are stored in an interface of a semiconductor constituting the storage section, when the signal charges are stored in the storage section.

19. A solid-state image pickup device comprising:
a semiconductor substrate,
a plurality of photosensitive pixels for converting incident light on the semiconductor substrate into signal charges,
storage sections which temporarily store the converted signal charges, respectively, and
a charge transfer section which successively transfers the signal charges after the signal charges are transferred from the storage sections, respectively,
wherein at least the photosensitive pixel and the charge transfer section have the same number, respectively, one charge transfer section only transfers a charge of a corresponding one photosensitive pixel, and electric charges having a polarity opposite to that of the stored signal charges are stored in an interface of a semiconductor constituting the storage section, when the signal charges are stored in the storage section, and
the charge transfer section transfers and selectively outputs the signal charge, one by one, of a photosensitive pixel included in the plurality of photosensitive pixels.

* * * * *